(12) United States Patent
Sakuma

(10) Patent No.: US 7,964,464 B2
(45) Date of Patent: Jun. 21, 2011

(54) SEMICONDUCTOR DEVICE AND METHOD OF MANUFACTURING THE SAME

(75) Inventor: Takashi Sakuma, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 566 days.

(21) Appl. No.: 12/040,426

(22) Filed: Feb. 29, 2008

(65) Prior Publication Data
US 2008/0211031 A1 Sep. 4, 2008

(30) Foreign Application Priority Data

Mar. 2, 2007 (JP) ................. 2007-052387

(51) Int. Cl.
*H01L 21/314* (2006.01)
*H01L 21/8236* (2006.01)

(52) U.S. Cl. .. 438/278; 438/302; 438/306; 257/E21.268

(58) Field of Classification Search .................. 438/278, 438/302, 306
See application file for complete search history.

(56) References Cited

U.S. PATENT DOCUMENTS
5,614,432 A 3/1997 Goto et al.
2004/0087095 A1 5/2004 Handa et al.

FOREIGN PATENT DOCUMENTS
JP 7-297397 A 11/1995
JP 08-130193 A 5/1996
JP 2004-134449 A 4/2004

OTHER PUBLICATIONS

Chinese Office Action dated Sep. 11, 2009, issued in corresponding Chinese Patent Application No. 200810082363.
Korean Office Action dated Jan. 26, 2010, issued in corresponding Korean Patent Application No. 10-2008-0019380.

*Primary Examiner* — Alexander G Ghyka
(74) *Attorney, Agent, or Firm* — Westerman, Hattori, Daniels & Adrian, LLP

(57) ABSTRACT

A device isolation film is formed in a semiconductor substrate at a border portion between a first region and a second region for defining a first active region in the first region and a second active region in the second region. A gate insulating film and a gate electrode is formed over the semiconductor substrate in the first region. A first photoresist film covering the second region and having an opening exposing the first active region and having an edge on the border portion of the opening positioned nearer the second active region than a middle of the device isolation film is formed over the semiconductor substrate with the gate electrode. Impurity ions are implanted from a direction tilted from a normal direction of the semiconductor substrate with the first photoresist film and the gate electrode as a mask to form pocket regions in the semiconductor substrate on both sides of the gate electrodes.

13 Claims, 20 Drawing Sheets

GATE LENGTH DIRECTION

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2007-052387, filed on Mar. 2, 2007, the entire contents of which are incorporated herein by reference.

BACKGROUND

The present invention relates to a semiconductor device and a method of manufacturing the same, more specifically, a semiconductor device including a pocket region formed by tilt-angle ion implantation, and a method of manufacturing the semiconductor device.

MISFETs, to suppress the threshold voltage decrease due to the short channel effect, generally impurity doped region called a pocket or a halo (hereinafter called a pocket region) are formed by locally increasing an impurity concentration below the gate electrode.

The pocket region is formed usually by tilt-angle ion implantation in a direction tilted to the normal of a semiconductor substrate after gate electrodes have been formed on the semiconductor substrate. The pocket region is formed by the tilt-angle ion implantation.

However, as the distance between elements of different conduction types becomes smaller for higher densities of semiconductor devices, the so-called shadowing or shadow effect becomes conspicuously influential, and the ions incident on a tilted direction are shaded by a photoresist and cannot be implanted into required region.

One means of suppressing the shadowing will be thinning the photoresist film. However, the photoresist film can be thinned only in the range where the photoresist film can make the intrinsic function of masking the implantation into undesirable region. As the photoresist film is more thinned, steps below appear conspicuously as the surface steps of the photoresist film, which makes it difficult to ensure the flatness and the fine processing after the photoresist film has been applied. For these reasons, the thinning of the photoresist film is restricted.

SUMMARY

According to one aspect of an embodiment, there is provided a method of manufacturing a semiconductor device having: forming, in a semiconductor substrate at a border portion between a first region and a second region, a device isolation film for defining a first active region in the first region and a second active region in the second region; forming, over the semiconductor substrate in the first region, a gate insulating film and a gate electrode; forming, over the semiconductor substrate with the gate electrode, a first photoresist film covering the second region and having an opening exposing the first active region and having an edge on the border portion of the opening positioned nearer the second active region than a middle of the device isolation film; and implanting impurity ions from a direction tilted from a normal direction of the semiconductor substrate with the first photoresist film and the gate electrode as a mask to form a pair of pocket regions in the semiconductor substrate on both sides of the gate electrodes.

According to another aspect of an embodiment, there is provided a semiconductor device having: a first transistor formed in a first region of a semiconductor substrate and including a first gate insulating film and a first gate electrode formed over the semiconductor substrate, first source/drain regions formed in the semiconductor substrate on both sides of the first gate electrode and first pocket regions formed between the semiconductor substrate in a region below the first gate electrode and the first source/drain regions; a second transistor formed in a second region adjacent to the first region and having a conduction type different from a conduction type of the first transistor; a device isolation film formed between the first region and the second region; and a first impurity region doped with a first impurity for forming the first pocket regions nearer the second region beyond a middle of the device isolation film.

DETAILED DESCRIPTION OF THE PREFERRED EMBODIMENTS

The semiconductor device and the method of manufacturing the same according to a first embodiment of the present invention will be explained with reference to FIGS. 1 to 12B.

Figure 1:
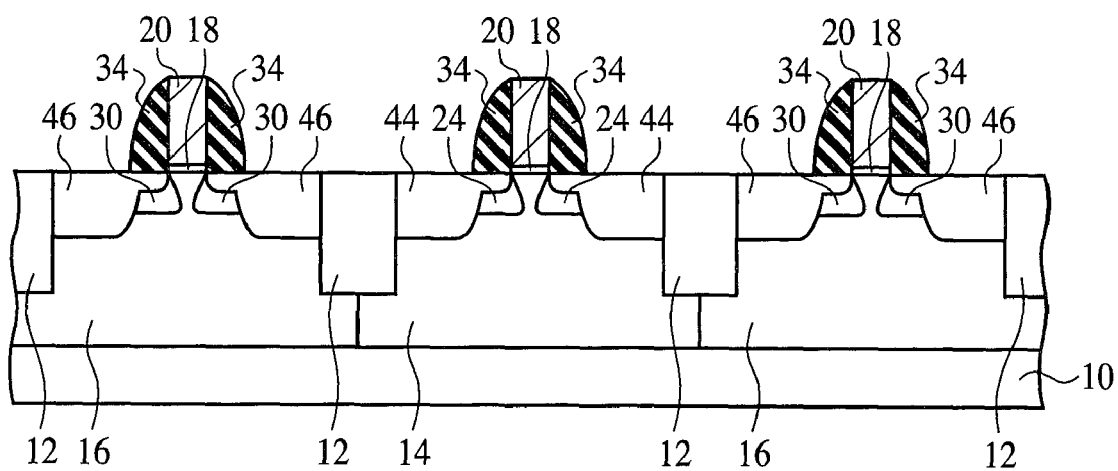
FIG. 1 is a diagrammatic sectional view showing the structure of the semiconductor device according to a first embodiment of the present invention.
Figure 6:
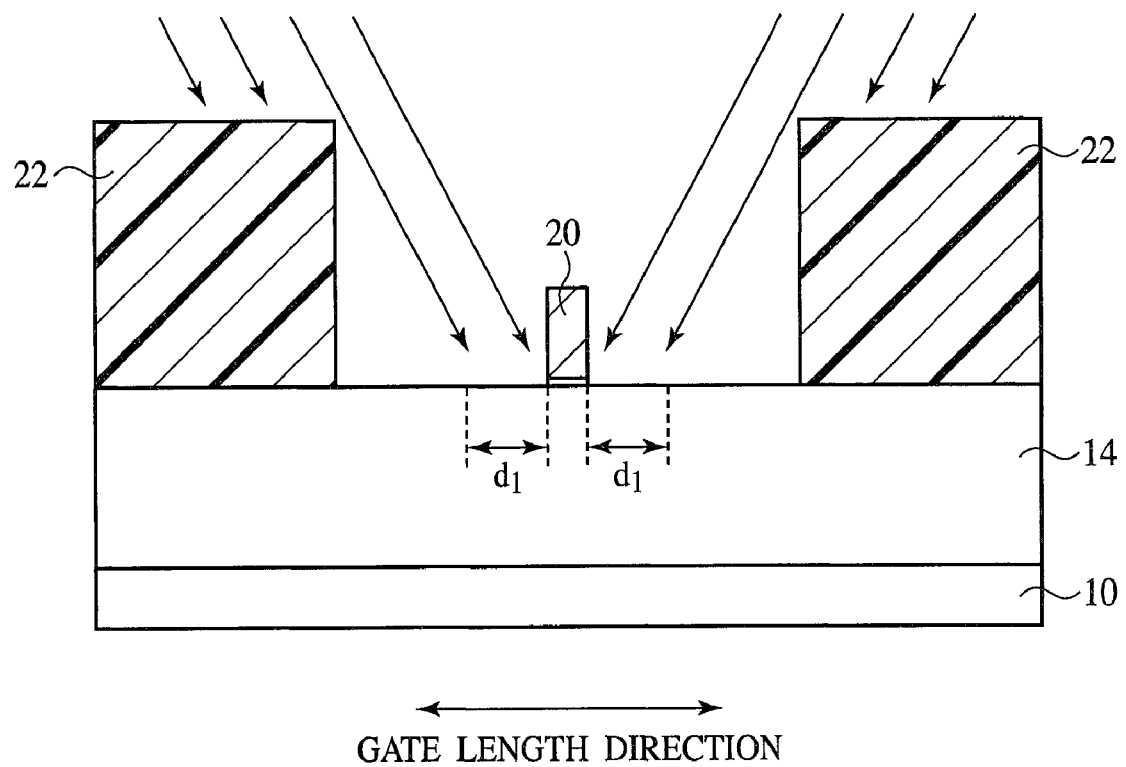
FIG. 6 is a diagrammatic sectional view showing the relationship between the ion implantation in a direction tilted toward the gate length direction and the shadowing.
Figure 7:
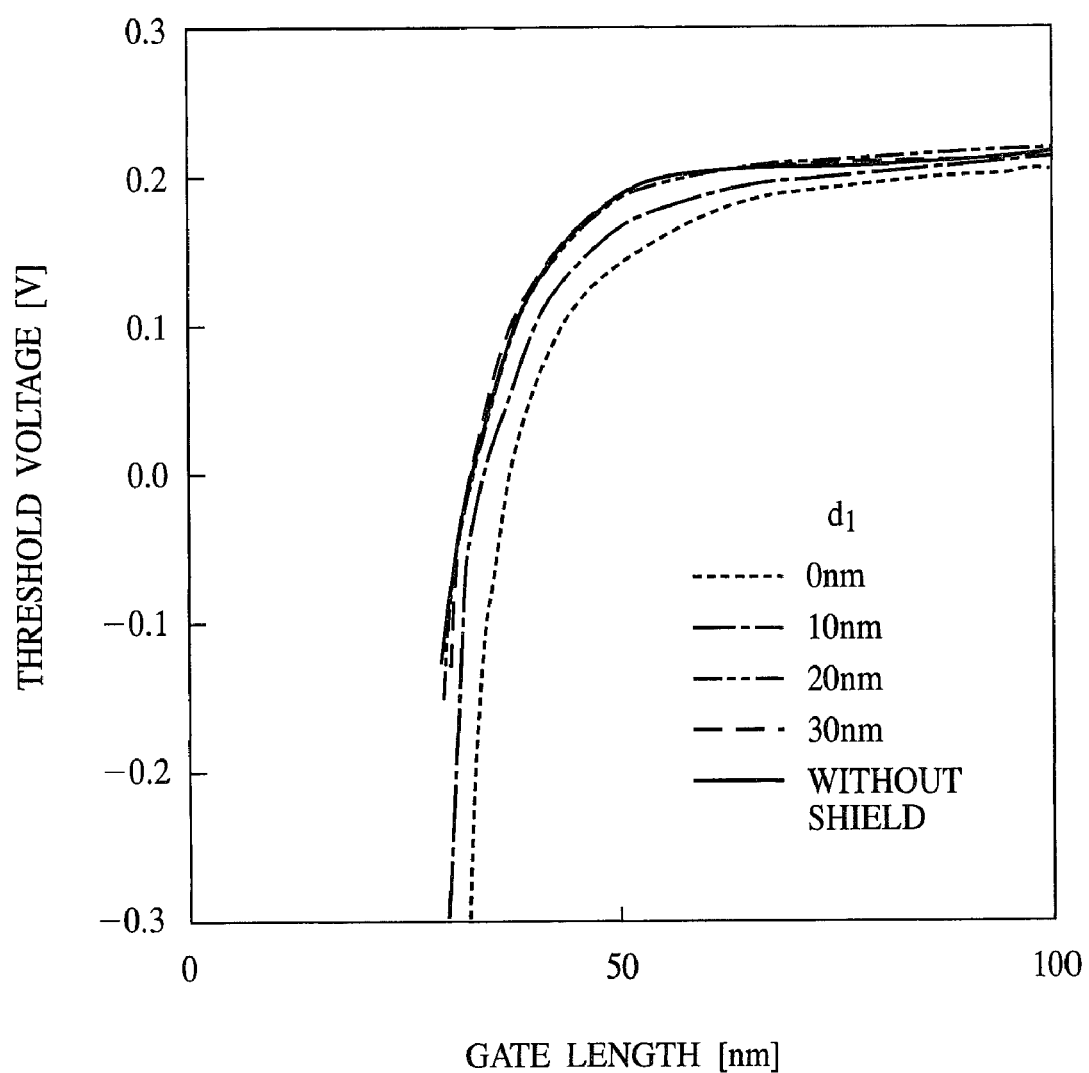
FIG. 7 is a graph showing the width $d_1$ dependency of the threshold voltage roll-off characteristics of the MISFET.
Figure 8A:
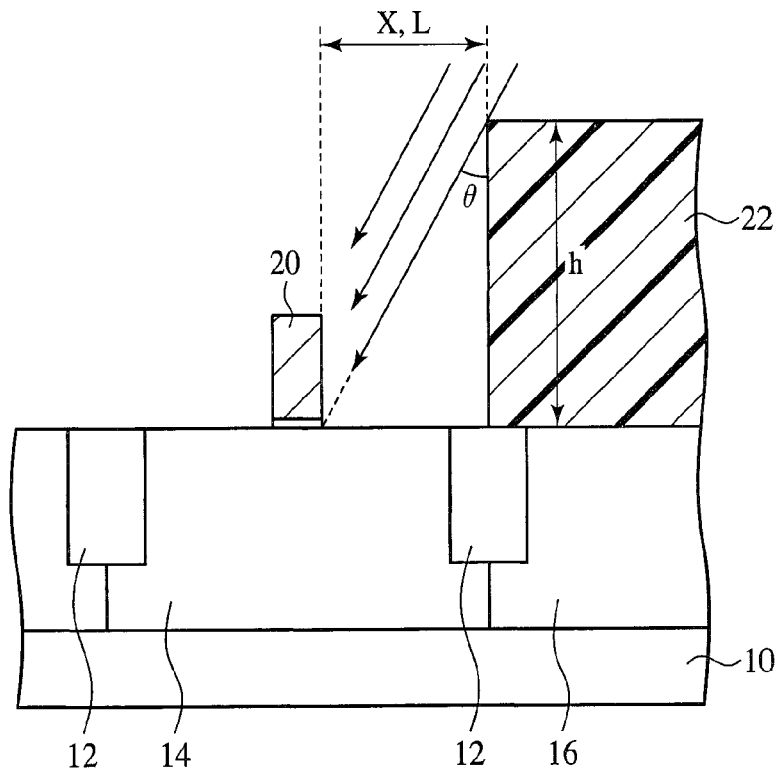
FIGS. 8A and 8B are diagrammatic sectional views showing the positional relationships among the gate electrode, the photoresist film and the implanted ions given when the ion implantation is made in a direction tilted toward the gate length direction.
Figure 8B:
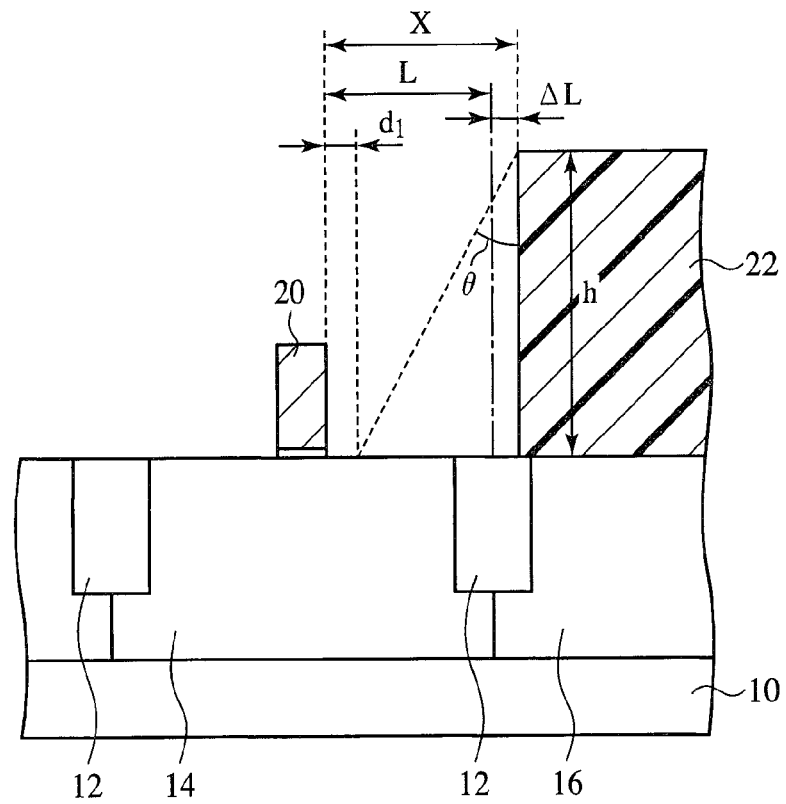
Figure 9:
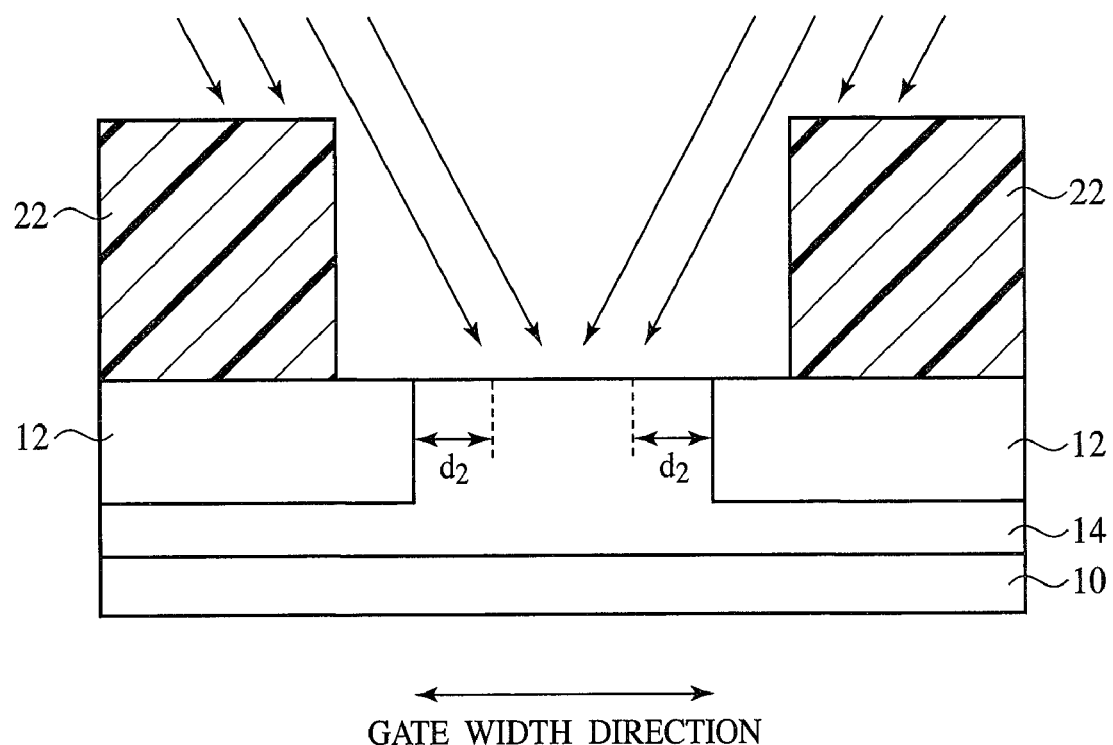
FIG. 9 is a diagrammatic sectional view showing the relationship between the ion implantation in a direction tilted toward the gate width direction and the shadowing.
Figure 10:
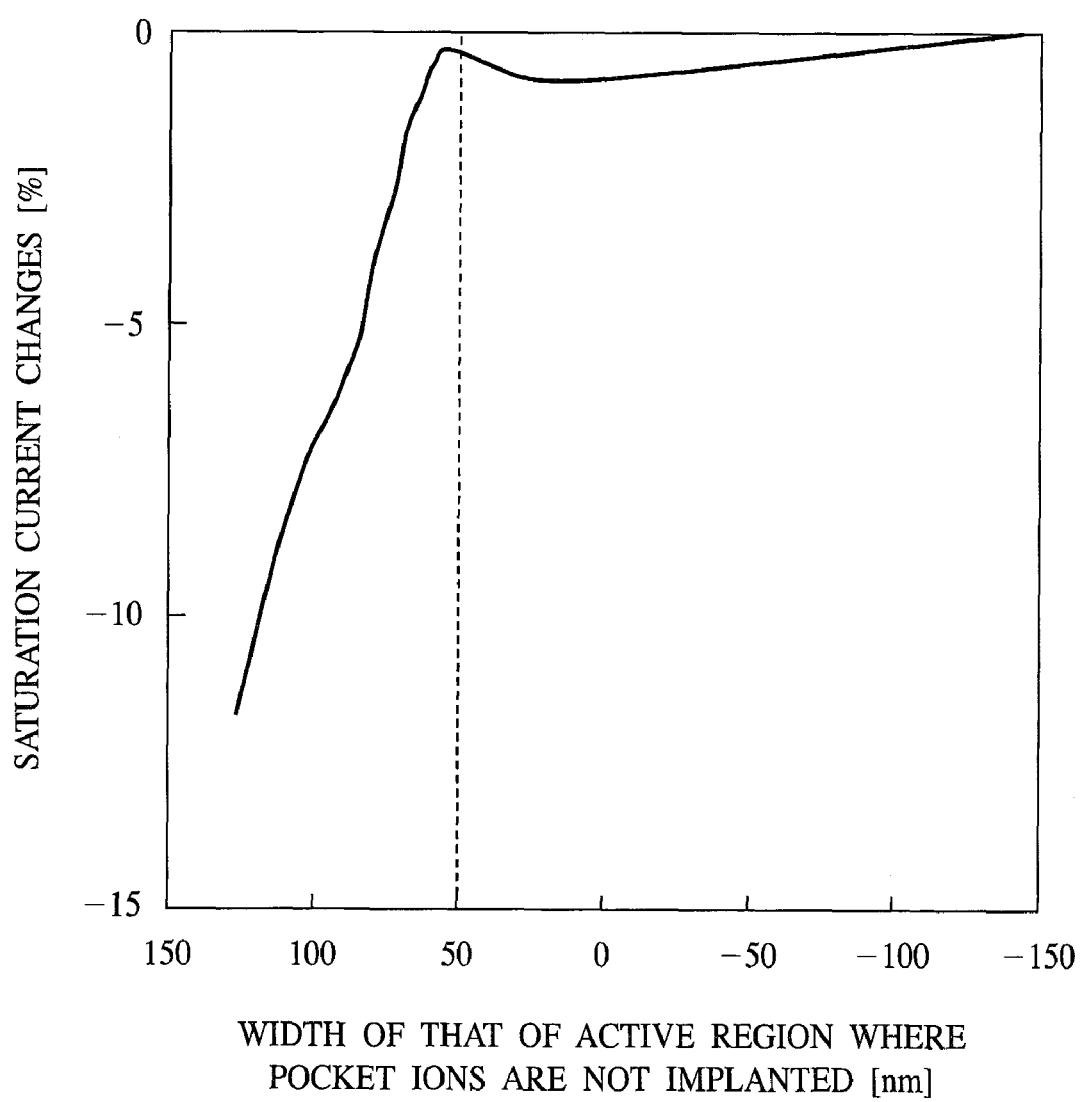
FIG. 10 is a graph showing the width $d_2$ dependency of the saturation current changes given when the ion implantation is made in a direction tilted toward the gate width direction.
Figure 11A:
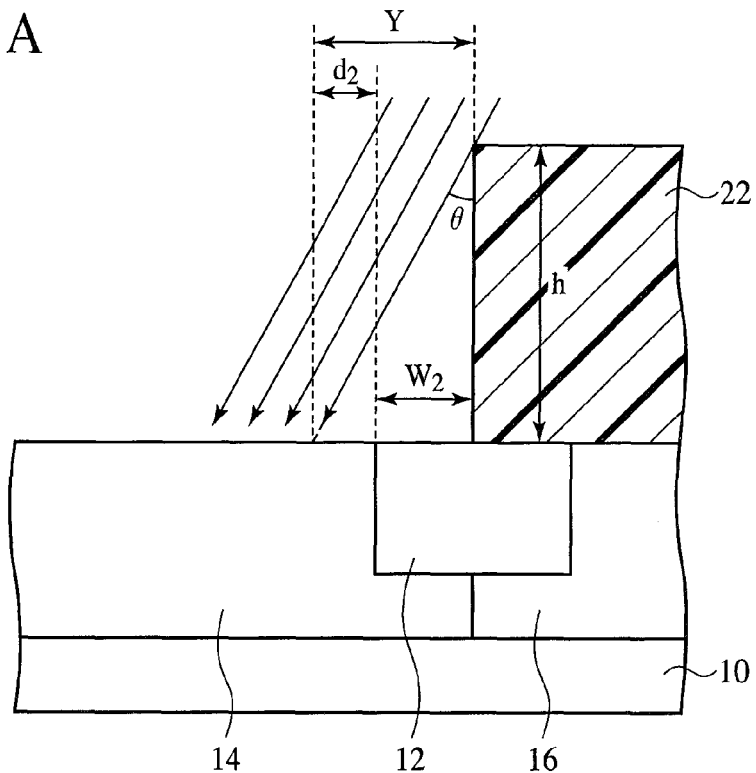
FIGS. 11A and 11B are diagrammatic sectional views showing the positional relationships among the active region, the photoresist film and the implanted ions given when the ion implantation is made in a direction tilted toward the gate width direction.
Figure 11B:
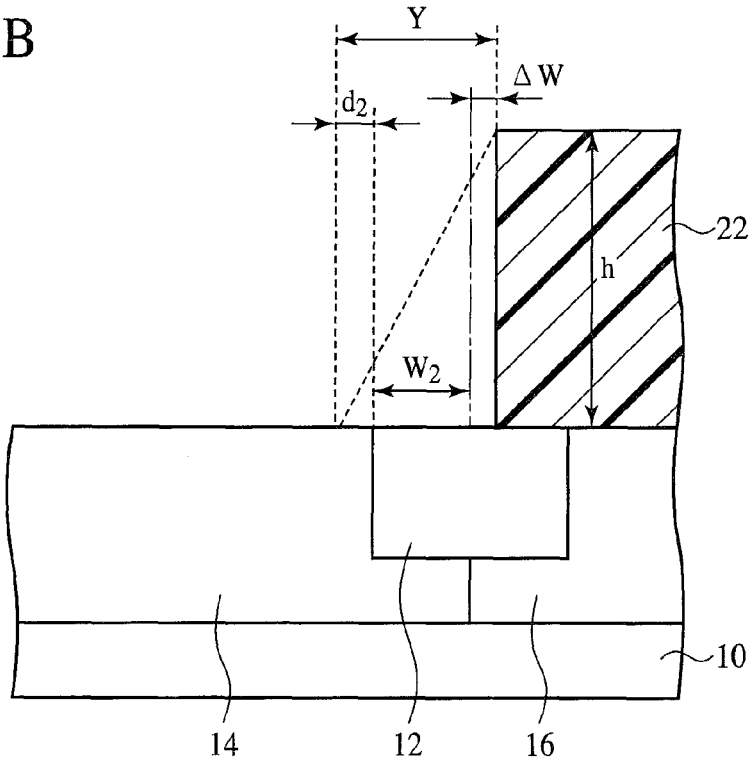
Figure 12A:
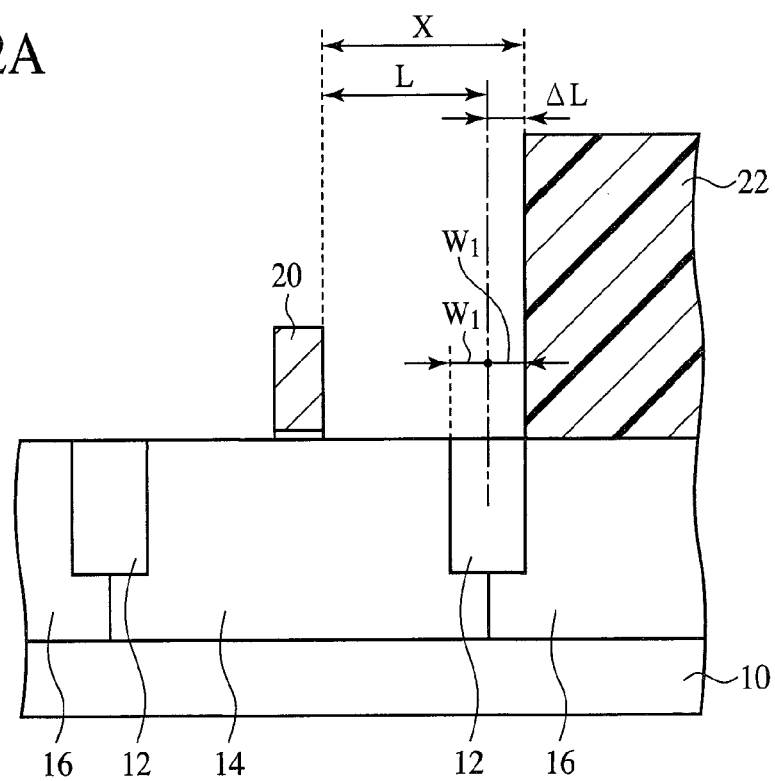
FIGS. 12A and 12B are diagrammatic sectional views showing the structures of the semiconductor device with the shift quantities $\Delta L$, $\Delta W$ being maximum value.
Figure 12B:
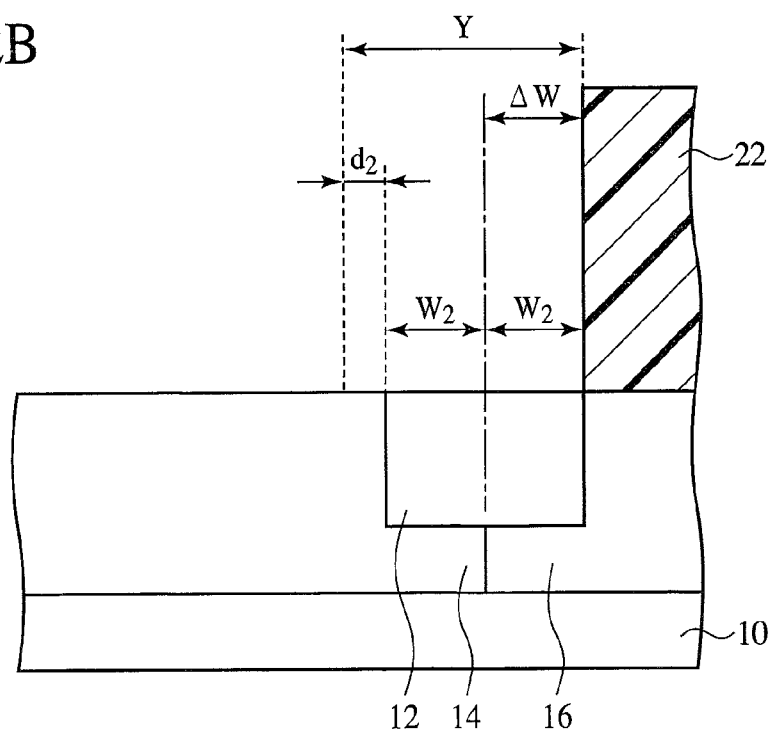

FIG. 1 is a diagrammatic sectional view showing the structure of the semiconductor device according to the present embodiment. FIGS. 2A-2C, 3A-3C, 4A-4C and 5A-5C are sectional views showing the method of manufacturing the semiconductor device according to the present embodiment. FIG. 6 is a diagrammatic sectional view showing the relationship between the ion implantation in a direction tilted toward the gate length direction and the shadowing. FIG. 7 is a graph showing the width $d_1$ dependency of the threshold voltage roll-off characteristics of the MISFET. FIGS. 8A and 8B are diagrammatic sectional views showing the positional relationships among the gate electrode, the photoresist film and the implanted ions given when the ion implantation is made in a direction tilted toward the gate length direction. FIG. 9 is a diagrammatic sectional view showing the relationship between the ion implantation in a direction tilted toward the gate width direction and the shadowing. FIG. 10 is a graph showing the width $d_2$ dependency of the saturation current changes given when the ion implantation is made in a direction tilted toward the gate width direction. FIGS. 11A and 11B are diagrammatic sectional views showing the positional relationships among the active region, the photoresist film and the implanted ions given when the ion implantation is made in a direction tilted toward the gate width direction. FIGS. 12A and 12B are diagrammatic sectional views showing the structures of the semiconductor device with the shift quantities ΔL, ΔW being maximum value.

First, the structure of the semiconductor device according to the present embodiment will be explained with reference to FIG. 1.

In a silicon substrate 10, a device isolation film 12 for defining active regions is formed. In the drawing, the middle active region is an n-channel MISFET forming region, and the left and the right regions are p-channel MISFET forming region. In the silicon substrate 10 of the n-channel MISFET forming region, a p-well 14 is formed. In the silicon substrate 10 of the p-channel MISFET forming region, an n-well 16 is formed.

In the active region of the n-channel MISFET forming region, a gate electrode 20 is formed with a gate insulating film 18 interposed therebetween. On the side wall of the gate electrode 20, a sidewall insulating film 34 is formed. In the silicon substrate 10 on both sides of the gate electrode 20, p-type pocket regions 24 and n-type source/drain regions 44 are formed. Thus, in the n-channel MISFET forming region, an n-channel MISFET including the gate electrode 20, the source/drain regions 44 and the pockets regions 24 is formed.

In the active regions of the p-channel MISFET forming regions, gate electrodes 20 are respectively formed with the gate insulating film 18 interposed therebetween. On the side walls of the gate electrodes 20, a sidewall insulating film 34 is formed. In the silicon substrate 10 on both sides of the gate electrodes 20, n-type pocket regions 30 and p-type source/drain regions 46 are respectively formed. Thus, in the respective p-channel MISFET forming regions, p-channel MISFET including the gate electrode 20, the source/drain regions 46 and the pocket regions 30 are formed.

Thus, the semiconductor device according to the present embodiment includes the n-channel MISFET and p-channel MISFETs, and the n-channel MISFET and the p-channel MISFETs are neighbor to each other with the device isolation film 30 therebetween.

Next, the method of manufacturing the semiconductor device according to the present embodiment will be explained with reference to FIGS. 2A to 5C.

Figure 2A:
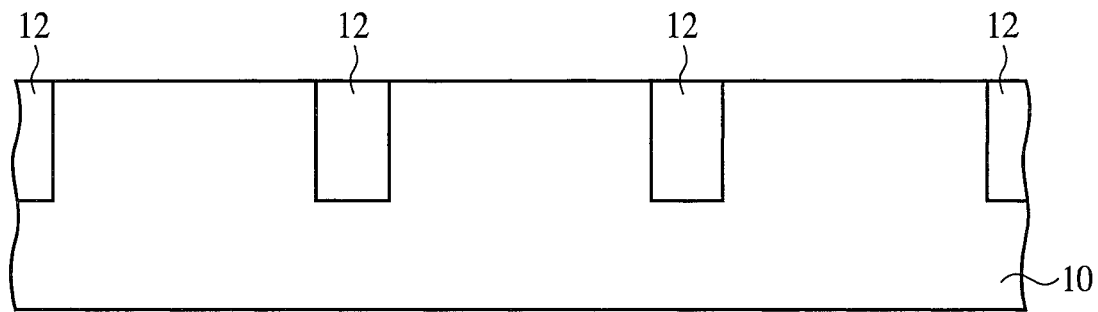
FIGS. 2A-2C, 3A-3C, 4A-4C and 5A-5C are sectional views showing the method of manufacturing the semiconductor device according to the first embodiment of the present invention.

First, over the surface of the silicon substrate 10, the device isolation film 12 is formed by, e.g., Shallow Trench Isolation (STI) method (FIG. 2A). In FIG. 2A, the middle one of the active regions defined by the device isolation film 12 is the n-channel MISFET forming region, and the left and the right active regions are p-channel MISFETs forming regions. Usually, in the region where especially an n-channel MISFET forming region and a p-channel MISFET forming region are adjacent to each other, the border between the n-channel MISFET forming region and the p-channel MISFET forming region is positioned at the middle of the device isolation film 12.

Figure 2B:
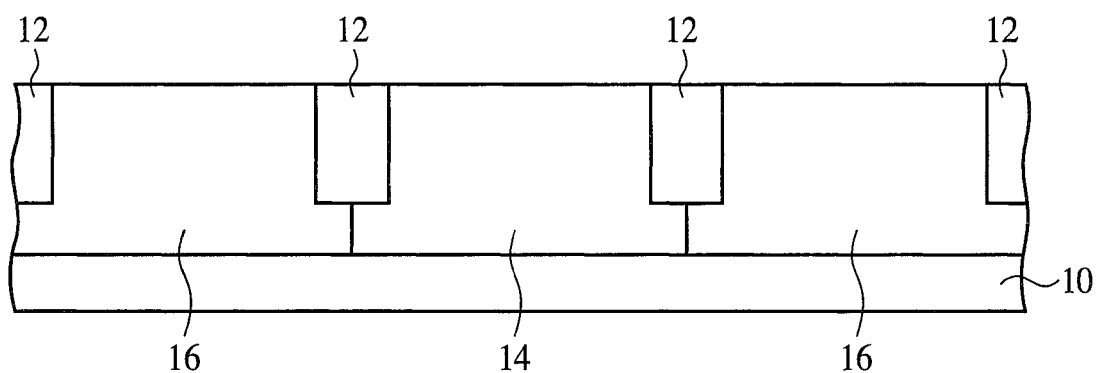

Then, by photolithography and ion implantation, a p-type impurity and an n-type impurity are implanted respectively selectively into the n-channel MISFET forming region and the p-channel MISFET forming region. The ion implantation into the respective regions includes well implantation, channel stop implantation, channel implantation, etc. Thus, the p-well 14 is formed in the n-channel MISFET forming region, and the n-wells 16 are formed in the p-channel MISFET forming regions (FIG. 2B).

Then, the silicon substrate 10 is thermally oxidized in, e.g., an oxygen atmosphere of 900° C. to thereby form a silicon oxide film of, e.g., a 1.0 nm-thickness on the silicon substrate 10 in the active regions defined by the device isolation film 12.

Figure 2C:
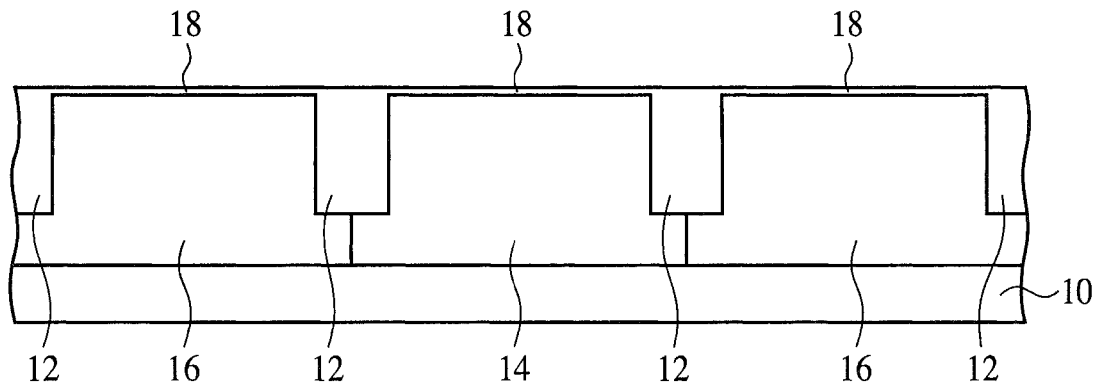

Next, with, e.g., a remote plasma processing system, the silicon oxide film is exposed to nitrogen plasma for 60 minutes to thereby introduce nitrogen into the silicon oxide film. Thus, the gate insulating film 18 of silicon oxynitride film is formed (FIG. 2C).

In place of the remote plasma processing, thermal processing may be made in, e.g., an NO gas atmosphere to thereby introduce nitrogen into the silicon oxide film. In this case, the gas pressure can be, e.g., 665 Pa, and the thermal processing period of time can be, e.g., 30 seconds.

Next, over the entire surface, a 100 nm-thickness polycrystalline silicon film, for example, is deposited by, e.g., CVD method.

Figure 3A:
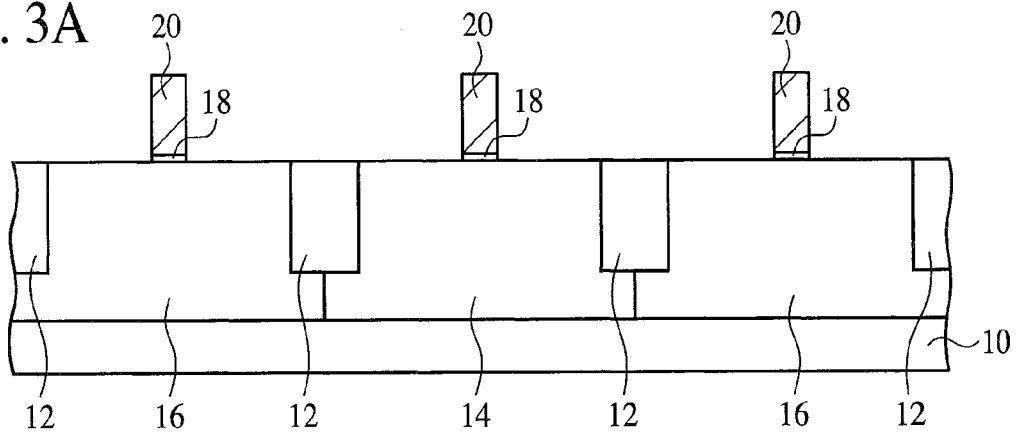

Next, by photolithography and dry etching, the polycrystalline silicon film is patterned to form the gate electrodes 20 of the polycrystalline silicon film in the respective active regions (FIG. 3A)

Although omitted in the method of manufacturing the semiconductor device according to the present embodiment, it is possible that after the gate electrodes 20 have been formed, a 5-20 nm-thickness sidewall insulating film is formed on the side walls of the gate electrodes 20, and the following steps are made. This sidewall insulating film may be formed on either of the n-channel MISFET and the p-channel MISFETs. This sidewall insulating film can be used in controlling the implantation positions for the pocket regions and the extension regions, and others. The extension regions here are impurity doped regions of the same conduction type as the source/drain regions, has the junction depth smaller than the source/drain regions and formed nearer the channel region than the source/drain regions.

Then, by photolithography, a photoresist film 22 covering the p-channel MISFET forming regions and exposing the n-channel MISFET forming region is formed.

In the method of manufacturing the semiconductor device according to the present embodiment, the edges of the opening of the photoresist film 22 are positioned nearer the p-channel MISFET forming regions than the middles of the device isolation film (the borders between the n-channel MISFET forming region and the p-channel MISFET forming regions). The reason for thus patterning the photoresist film 22 will be described later.

Figure 3B:
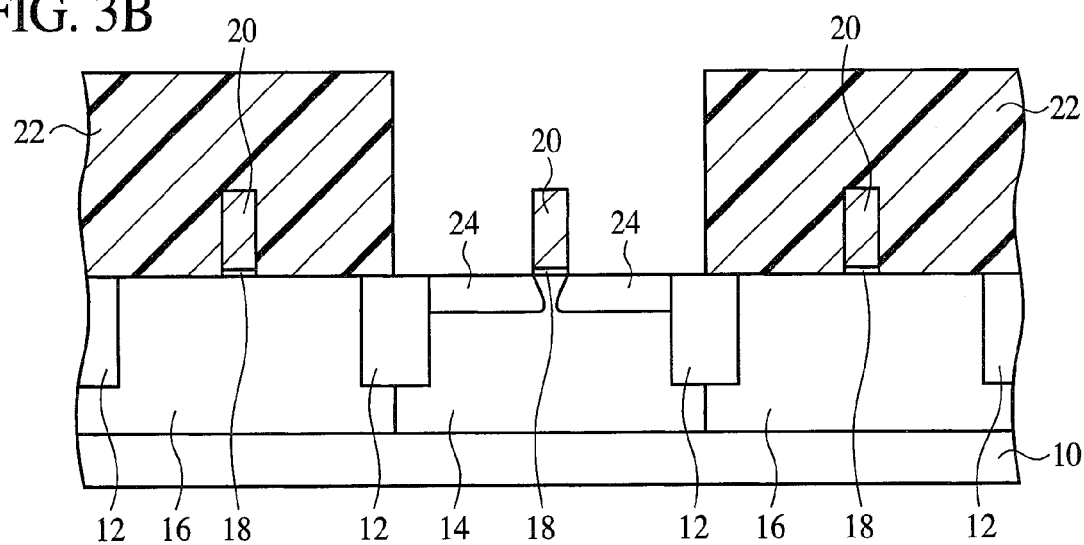

Then, with the photoresist film 22 and the gate electrode 20 as the mask, p-type impurity ions, e.g. boron ions, are implanted to form the pocket regions 24 in the silicon substrate 10 on both sides of the gate electrode 20 (FIG. 3B). At this time, the impurity ions are implanted in two directions tilted toward the extending direction of the gate electrode 20 with respect to the normal direction of the silicon substrate 10 and in two directions tilted toward the direction perpendicular to the extending direction of the gate electrode 20 with respect to the normal direction of the silicon substrate 10. The conditions for the ion implantation are, e.g., boron ions as the impurity ions, a 7 keV acceleration energy, a $1 \times 10^{13}$ cm$^{-2}$ dose and a 30° tilt angle.

Figure 3C:
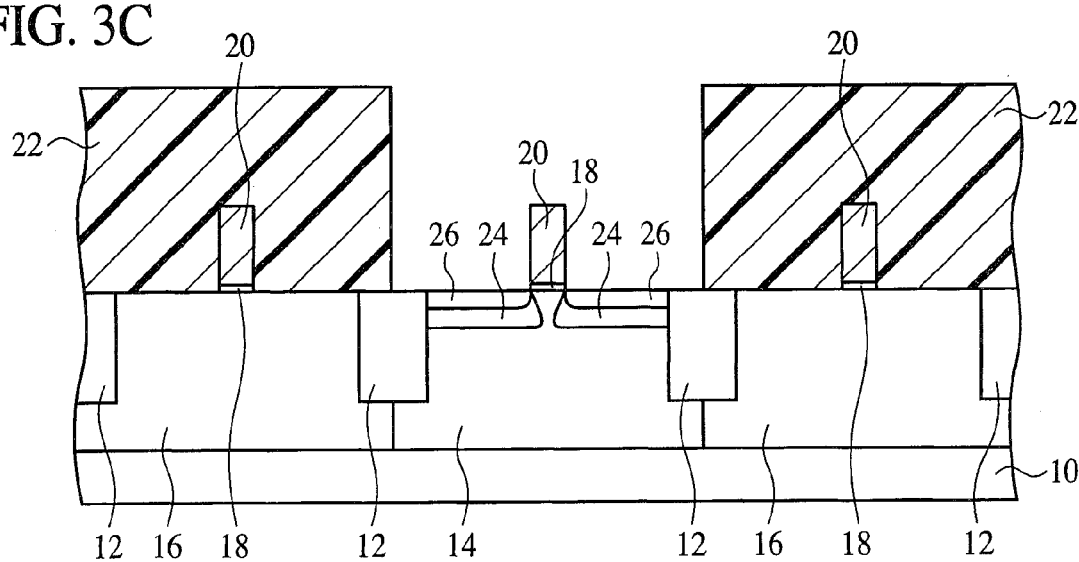

Then, with the photoresist film 22 and the gate electrode 20 as the mask, n-type impurity ions, e.g. phosphorus ions, are implanted to form the impurity diffused regions 26 as the extension regions in the silicon substrate 10 on both sides of the gate electrode 20 (FIG. 3C). At this time, the impurity ions are implanted in the normal direction of the silicon substrate 10.

Next, by, e.g., ashing, the photoresist film 22 is removed.

Next, by photolithography, a photoresist film 28 covering the n-channel MISFET forming region and exposing the p-channel MISFET forming regions is formed.

In the method of manufacturing the semiconductor device according to the present embodiment, the edges of the opening of the photoresist film 28 are positioned nearer the n-channel MISFET forming region than the middles of the device isolation film (the borders between the n-channel MISFET forming region and the p-channel MISFET forming regions). The reason for thus patterning the photoresist film 28 will be described later.

Figure 4A:
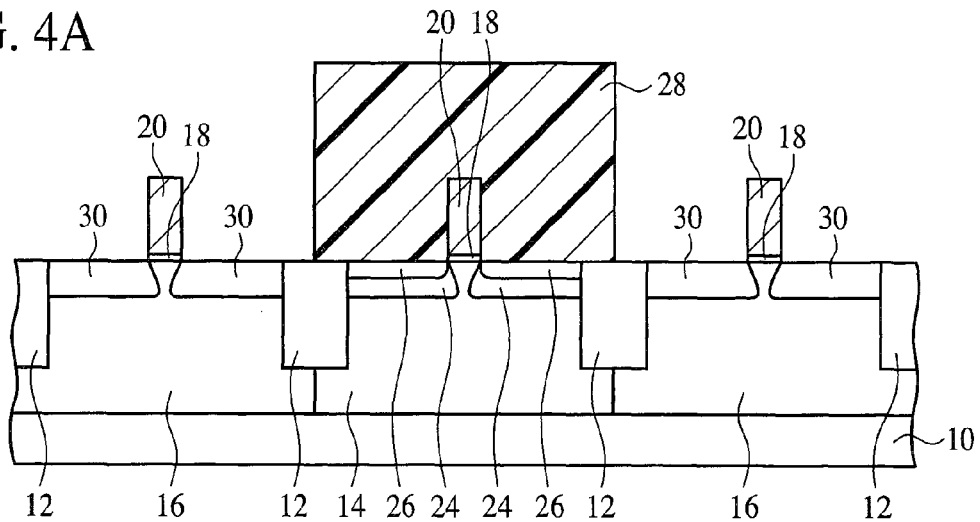

Then, with the photoresist film 28 and the gate electrodes 20 as the mask, n-type impurity ions, e.g. phosphorus ions, are implanted to form the pocket regions 30 in the silicon substrate 10 on both sides of the gate electrodes 20 (FIG. 4A). At this time, the impurity ions are implanted in two directions tilted by, e.g., 45 degrees toward the extending direction of the gate electrodes 20 with respect to the normal direction of the silicon substrate 10 and in two directions tilted by, e.g., 45 degrees toward the direction perpendicular to the extending direction of the gate electrodes 20 with respect to the normal direction of the silicon substrate 10.

Figure 4B:
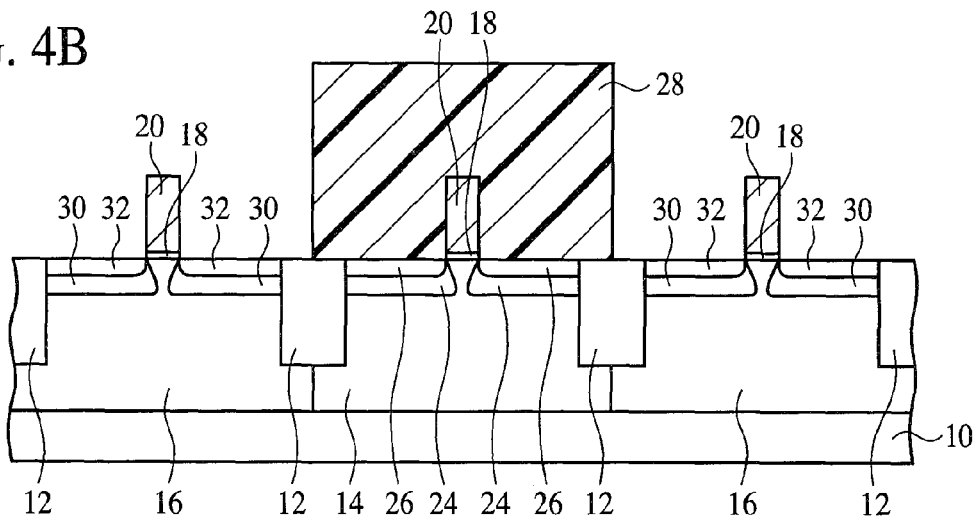

Then, with the photoresist film 28 and the gate electrodes 20 as the mask, p-type impurity ions, e.g. boron ions, are implanted to form the impurity diffused regions 32 as the extension regions in the silicon substrate 10 on both sides of the gate electrodes 20 (FIG. 4B). At this time, the impurity ions are implanted in the normal direction of the silicon substrate 10.

Next, by, e.g., ashing, the photoresist film 28 is removed.

The photoresist films 22, 28 of the above-described patterns are used to form the pocket regions 24, 30, whereby the regions with the impurity implanted, which form the pocket regions 24 are formed nearer the p-channel MISFET forming regions than the middle of the device isolation film, and the regions with the impurity forming the pocket regions 30 are formed nearer the n-channel MISFET forming region than the middle of the device isolation film 12. Near the middle of the device isolation film 12, the regions with the impurity forming the pocket regions 24 and the impurity forming the pocket regions 30 implanted are formed.

Figure 4C:
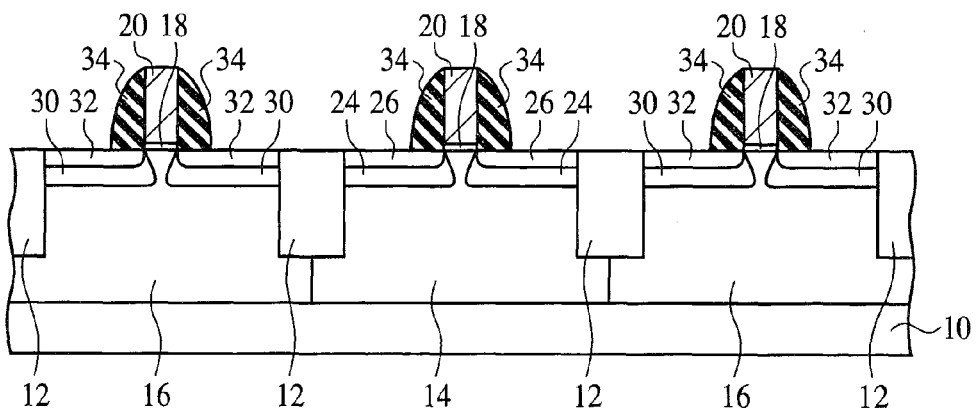

Next, a silicon oxide film is deposited by, e.g., CVD method and then etched back to form the sidewall insulating film 34 of the silicon oxide film on the side walls of the gate electrodes 20 (FIG. 4C).

Then, by photolithography, a photoresist film 36 covering the p-channel MISFET forming regions and exposing the n-channel MISFET forming region is formed.

Figure 5A:
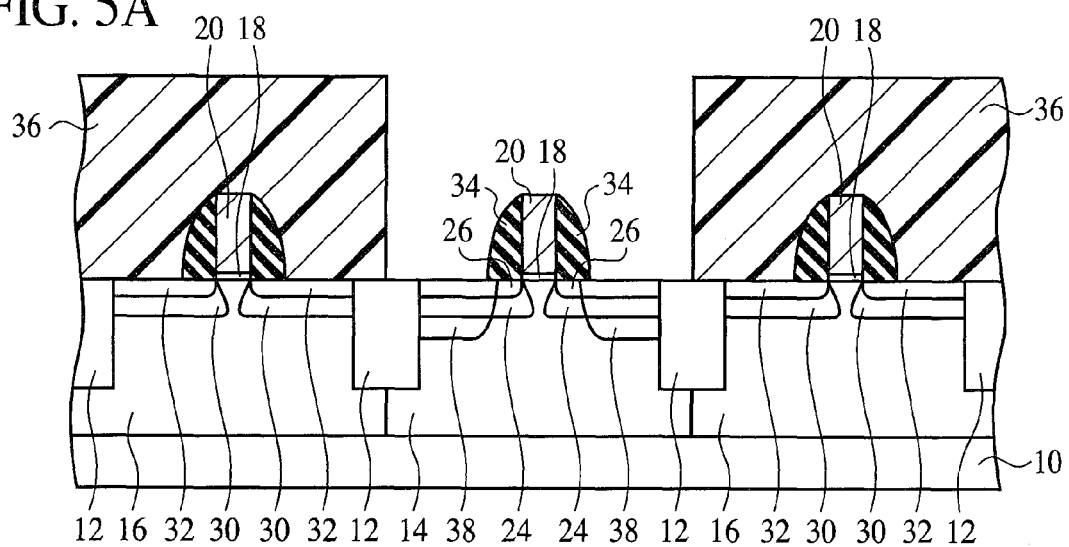

Next, with the photoresist film 36, the gate electrode 20 and the sidewall insulating film 34 as the mask, n-type impurity ions, e.g. arsenic ions, are implanted to form the impurity diffused regions 38 in the silicon substrate 10 on both sides of the gate electrode 20 (FIG. 5A).

Next, by, e.g., ashing, the photoresist film 36 is removed.

Then, by photolithography, a photoresist film 40 covering the n-channel MISFET forming region and exposing the p-channel MISFET forming regions is formed.

Figure 5B:
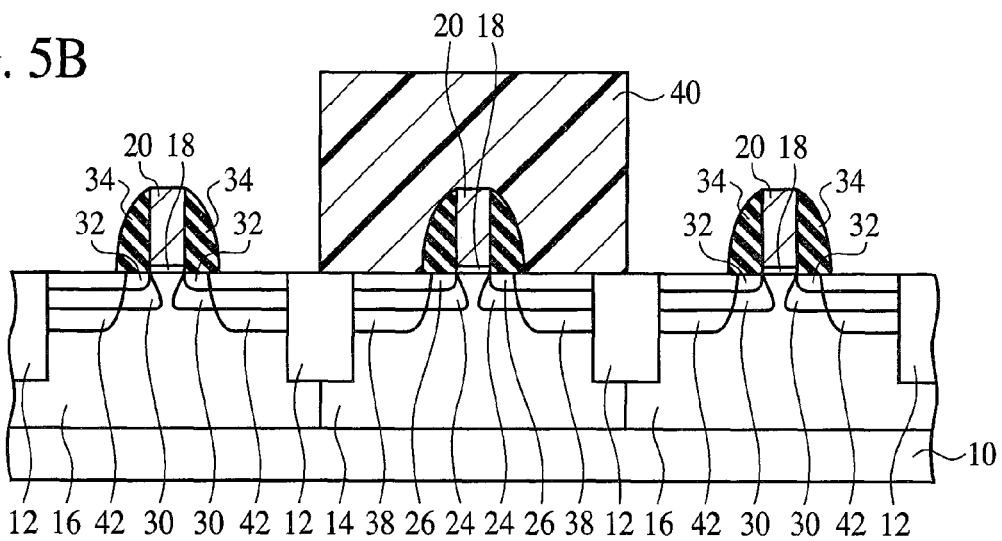

Next, with the photoresist film 40, the gate electrodes 20 and the sidewall insulating film 34 as the mask, p-type impurity ions, e.g. boron difluoride ions, are implanted to form the impurity diffused regions 42 in the silicon substrate 10 on both sides of the gate electrodes 20 (FIG. 5B).

Then, by, e.g., ashing, the photoresist film 40 is removed.

Figure 5C:
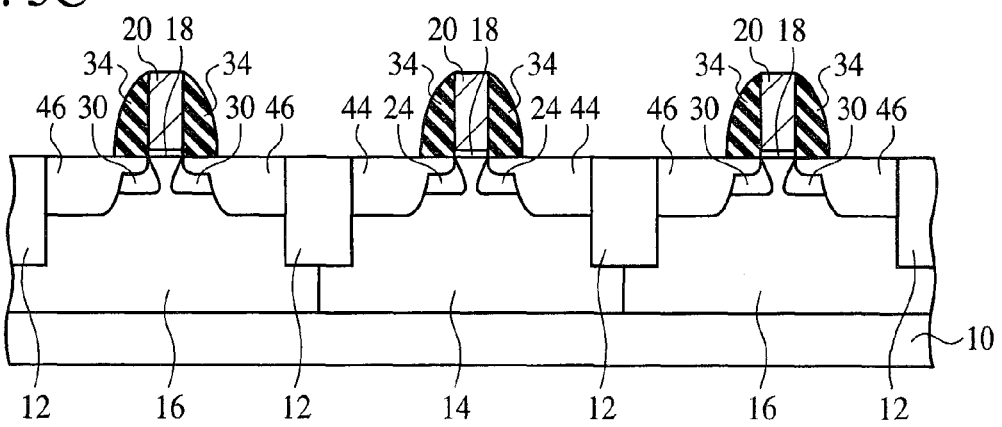

Next, the implanted impurities are activated by rapid thermal annealing to form the source/drain regions 44 formed of the impurity diffused regions 26, 38 with the pocket regions 24 in the n-channel MISFET forming region and the source/drain regions 46 formed of the impurity diffused regions 32, 42 with the pocket regions 30 (FIG. 5C).

Thus, in the n-channel MISFET forming region, the n-channel MISFET including the gate electrode 20, the source/drain regions 44 and the pocket regions 24 is formed, and in the p-channel MISFET forming regions, the p-channel MISFETs each including the gate electrode 20, the source/drain regions 46 and the pocket regions 30 are formed.

Here, the method of manufacturing the semiconductor device according to the present embodiment is characterized mainly by the patterns of the photoresist films 22, 28 used in forming the pocket regions 24, 30. The patterns of the photoresist films 22, 28 are set based on relationships with conditions for the pocket ion implantation for forming the pocket regions 24, 30. This setting can be made by altering patterns on reticles to be used in forming the photoresist films 22, 28.

The following description will be made with reference to the photoresist film 22 used in forming the n-channel MISFET. This is the same with the photoresist film 28 used in forming the p-channel MISFETs.

First, the method of setting the edges of the opening of the photoresist film 22, which is parallel to the extending direction of the gate electrode 20 (the gate width direction) will be explained with reference to FIGS. 6 to 8B.

The edge of the opening of the photoresist film 22, which is parallel to the extending direction of the gate electrode 20 is set based on relationships with the pocket ion implantation which is made in a direction tilted toward the direction (gate length direction) perpendicular to the extending direction of the gate electrode 20.

FIG. 6 is a diagrammatic section view showing the relationships between the pocket ion implantation made in a direction tilted toward the direction perpendicular to the extending direction of the gate electrode 20 and the shadowing.

When the ion implantation is made in a direction tilted toward the direction (transversely in the drawing) perpendicular to the extending direction of the gate electrode 20 (perpendicularly in the drawing), the ions to be implanted are introduced into the regions of a width $d_1$ from the ends of the gate electrode 20 due to the shadowing of the photoresist film 22. The ions implanted in the upper right direction are implanted also into the left side of the gate electrode 20, and the ions implanted in the upper left direction are implanted also in the right side of the gate electrode 20. However, the ions influencing the characteristics of the MISFET are implanted mainly into the regions of the width $d_1$ but are neglected here.

FIG. 7 is a graph of the width $d_1$ dependency of the threshold voltage roll-off characteristics given when the width along the gate length direction which permits the impurity ions implanted into a direction tilted toward the direction perpendicular to the extending direction of the gate electrode 20 to be implanted without being influenced by the shadowing of the photoresist film 22 is $d_1$. In the sample used for the measurement, the pocket regions are formed by implanting boron ions as impurity ions at a 7 keV acceleration energy at a 30° tilt angle to a dose of $1 \times 10^{13}$ cm$^{-2}$.

In the graph, the dotted line indicates the characteristics with the width $d_1$ being 0 nm; the one-dot chain line indicates the characteristics with the width $d_1$ being 10 nm; the two-dot chain line indicates the characteristics with the width $d_1$ being 20 nm; the broken line indicates the characteristics with the width $d_1$ being 30 nm; and the solid line indicates the characteristics without the photoresist film 22 (without shielding).

As shown in FIG. 7, when the width $d_1$ is not more than 10 nm (the dotted line and the one-dot chain line), in comparison with the case without the photoresist film 22 (the solid line), the characteristic curve shifts right, which shows the short channel effect takes place over a larger gate length. That is, the suppression of the short channel effect by the pocket region 24 is insufficient.

In contrast to this, when the width $d_1$ is more than 10 nm, it is shown that substantially the same characteristics as those of the case without the shadowing (the solid line) is obtained. That is, the short channel effect is sufficiently suppressed by the pocket region 24.

As described above, the width $d_1$ is very influential to the short channel effect of the MISFET, and it is necessary to set the edge of the opening of the photoresist film 22, which is parallel to the extending direction of the gate electrode 20 so that a width $d_1$ which sufficiently provides the effect of suppressing the short channel effect can be obtained.

The width $d_1$ necessary to suppress the short channel effect varies depending on dimensions of the MISFET, conditions of the ion implantation for the pocket regions, etc., and others, and it is preferable to optimize the width $d_1$ in accordance with characteristics of the respective MISFETs.

FIGS. 8A and 8B are diagrammatic sectional views showing the positional relationships among the gate electrode 20, the photoresist film 22 and the ion implantation given when the ion implantation is made in the direction tilted toward the direction perpendicular to the extending direction of the gate electrode 20.

When a distance from the end of the gate electrode 20 to the edge of the opening of the photoresist film 22 is X, a film thickness of the photoresist film 22 is h, and an incidence angle (tilt angle) of ions to be implanted to the normal direction of the silicon substrate 10 is θ, as shown in FIG. 8A, the relationship $$X = h \times \tan \theta$$

is given when the edge of the opening of the photoresist film 22 is positioned at the middle of the device isolation film 12. That is, when a distance X has the relationship $$X \leq h \times \tan \theta$$

due to the shadowing by the photoresist film 22, the ion implantation cannot be made between the gate electrode 20 and the device isolation film 12. That is, to form the pocket regions 34, at least the distance X must satisfy the following relationship.

$$X > h \times \tan \theta$$

Considering the width $d_1$ along the gate length direction which permits impurity ions to be implanted without being influenced by the shadowing by the photoresist film 22, in order to suppress the short channel effect of the MISFET, the following relationship must be satisfied.

$$X \geq h \times \tan \theta + d_1 \quad (1)$$

When the photoresist film 22, which is for discriminately implanting an n-type impurity and a p-type impurity, is formed, generally the edge of the opening of the photoresist film 22 is position at the middle of the device isolation film 12 formed between the p-channel MISFET forming region and the n-channel MISFET forming region on the border between the p-channel MISFET forming region and the n-channel MISFET forming region.

Accordingly, when the formula (1) is satisfied with the opening of the photoresist film 22 being positioned at the middle of the device isolation film 12 between the p-channel MISFET forming region and the n-channel MISFET forming region, it is not necessary to make changes to the pattern of the photoresist film 22. However, when a distance L from the end of the gate electrode 10 to the middle of the device isolation film 12 (the border between the n-channel MISFET forming region and the p-channel MISFET forming region) has the relationship $$L < h \times \tan \theta + d_1 \quad (2)$$

due to downsizing of the device, etc., the pocket regions 24 of prescribed characteristics cannot be formed due to the influence of the shadowing of the photoresist film 22.

In the method of manufacturing the semiconductor device according to the present embodiment, when the distance L, the film thickness h, the angle θ and the width $d_1$ satisfy the relationship of the formula (2), as shown in FIG. 8B, the edge of the photoresist film 22 is shifted by a prescribed quantity or more from the middle of the device isolation film 12 toward the p-channel MISFET forming region so that the distance X between the end of the gate electrode 20 and the edge of the opening of the photoresist film 22 is larger than $h \times \tan \theta + d_1$. That is, the shift quantity ΔL is defined so as to satisfy the following formula.

$$X = L + \Delta L \geq h \times \tan \theta + d_1$$

Specifically, the shift quantity ΔL is represented as follows.

$$\Delta L \geq h \times \tan\theta + d_1 - L \quad (3)$$

For example, when the film thickness h of the photoresist film 22 is 300 nm, the tilt angle is 30 degrees, the distance L is 180 nm, and the width $d_1$ is 20 nm, the shift quantity $\Delta L$ is 13 nm. In this case, the pattern on the reticle for forming the photoresist film 22 is designed so that the edge of the opening of the photoresist film 22 is shifted by 13 nm or more from the middle of the device isolation film 12 toward the p-channel MISFET forming region.

Next, the method of setting the edge of the opening of the photoresist film 22, which is perpendicular to the extending direction of the gate electrode 20 (gate width direction) will be explained with reference to FIGS. 9 to 11B.

The edge of the opening of the photoresist film 22, which is perpendicular to the extending direction of the gate electrode 20 is defined, based on the relationships with the ion implantation made in the direction tilted in the direction (gate length direction) parallel to the extending direction of the gate electrode 20.

FIG. 9 is a diagrammatic sectional view showing the relationships between the ion implantation in the direction tilted in the direction parallel to the extending direction of the gate electrode 20.

As shown in FIG. 9, when the ion implantation is made in both directions tilted in the direction (transversely in the drawing) parallel to the extending direction of the gate electrode 20 (transversely in the drawing), due to the shadowing of the photoresist film 22, only the ions applied in one direction are implanted in the active regions of a width $d_2$ from the end of the device isolation film 12.

FIG. 10 is a graph of the width $d_2$ dependency of the saturation current changes given when the ion implantation is made in a direction tilted in a direction parallel to the extending direction of the gate electrode 20. In the device used for the measurement, the length of the active region along the gate width direction was 200 nm. FIG. 10 shows the result of the case that the pocket regions are formed by implanting boron ions as the impurity ions at the acceleration energy of 7 keV at the tilt angle of 30 degree to the dose of $1 \times 10^{12}$ cm$^{-2}$.

As shown in FIG. 10, when the width $d_2$ is not more than 50 nm, no large change is found in the saturation current value. In contrast to this, when the width $d_2$ exceeds 50 nm, the saturation current value abruptly decreases. Based on the result of FIG. 10, it is found that to make no characteristics change to the MISFET, it is necessary that the width $d_2$ is not more than 50 nm.

That is, it is necessary to set the edge of the opening of the photoresist film 22, which is perpendicular to the extending direction of the gate electrode 20 is in the range that the width $d_2$ causes no characteristics change of the MISFET.

It is preferable that the a width $d_2$ necessary to prevent characteristics change of the MISFET, which varies depending on dimensions of the MISFET, ion implantation conditions for the pocket regions, etc., and others, is decided suitably for characteristics of the respective MISFETs.

FIGS. 11A and 11B are diagrammatic sectional views showing the positional relationships among the active region, the photoresist film 22 and the ion implantation given when the ion implantation is made in a direction tilted in a direction parallel to the extending direction of the gate electrode 20.

When a film thickness of the photoresist film 22 is h, an incidence angle (tilt angle) of the ion implantation, which is to the normal direction of the silicon substrate 10 is $\theta$, and a distance from the edge of the opening of the photoresist film 22 to a region an impurity ion is to be implanted into is Y, the following relationship is given among them as shown in FIG. 11A.

$$Y = h \times \tan\theta$$

With the edge of the opening of the photoresist film 22 being positioned at the middle of the device isolation film 12, when $$W_2 + d_2 \geq h \times \tan\theta$$

wherein a minimum value of a width along a gate width direction of a region impurity ions are not implanted, which causes no characteristics change of the MISFET is $d_2$, and a distance from the middle of the device isolation film 12 to the edge (a half of a device isolation width) is $W_2$ is satisfied, no characteristics change of the MISFET is caused, and it is not necessary to change the patterns of the photoresist film 22. However, $$W_2 + d_2 < h \times \tan\theta \quad (4)$$

is satisfied, characteristics changes of the MISFET are caused as described above.

Then, in the method of manufacturing the semiconductor device according to the present embodiment, when the distance $W_2$, the film thickness t, the angle $\theta$ and the width $d_2$ have the relationship of formula (4), the edge of the photoresist film 22 is shifted by $\Delta W$ from the middle of the device isolation film 12 toward the p-channel MISFET forming region so as to satisfy the following formula as shown in FIG. 11B.

$$W_2 + \Delta W + d_2 \geq h \times \tan\theta$$

Specifically, the shift quantity $\Delta W$ is represented as the following formula.

$$\Delta W \geq h \times \tan\theta - W_2 - d_2 \quad (5)$$

For example, when the film thickness h of the photoresist film 22 is 300 nm, the tilt angle $\theta$ is 30 degrees, the distance $W_2$ is 100 nm, and the width $d_2$ is 50 nm, the shift quantity $\Delta W$ is 23 nm. In this case, the pattern on the reticle for forming the photoresist film 22 is designed so that the edge of the opening of the photoresist film 22 is shifted by not less than 23 nm from the middle of the device isolation film 12 toward the p-channel MISFET forming region.

Based on the above-described results, for the edge of the opening of the photoresist film 22, which is parallel to the extending direction of the gate electrode 10, when the distance from the end of the gate electrode 20 to the middle of the device isolation film 12 has the relationship of $L < h \times \tan\theta + d_1$, the edge of the photoresist film 22 is shifted from the middle of the device isolation film 12 toward the p-channel MISFET forming region by a shift quantity $\Delta L$ ($\geq h \times \tan\theta + d_1 - L$).

For the edge of the opening of the photoresist film 22, which is perpendicular to the extending direction of the gate electrode 20, when $W_2 + d_2 < h \times \tan\theta$ is satisfied, the edge of the photoresist film 22 is shifted from the middle of the device isolation film 12 toward the n-channel MISFET forming region by a shift quantity $\Delta W$ ($\geq \times \tan\theta - W_2 - d_2$).

Maximum quantities of the shift quantities $\Delta L$, $\Delta W$ are defined by ranges where the pocket ion implantation is not introduced in the inverse conduction type MISFET forming regions, i.e., with the edge of the opening of the photoresist film 22 being positioned on the border between the device isolation film 12 and an active region adjacent via the device isolation film 12.

Specifically, a maximum value of the shift quantity $\Delta L$ is, as shown in FIG. 12A, $\Delta L = W_1$ when a distance from the middle of the device isolation film 12 to the edge is $W_1$. A maximum value of the shift quantity $\Delta W$ is, as shown in FIG.

12B, ΔW=W$_2$ when a distance from the middle of the device isolation film 12 to the edge (a half of a device isolation width) is W$_2$.

The maximum values of the shift quantities ΔL, ΔW are thus defined, whereby the pocket ion implantation introduced in the inverse conduction type MISFET forming regions is hindered from causing characteristics changes of the MISFETs.

As described above, according to the present embodiment, when the pocket regions of the MISFETs are formed by tilt-angle ion implantation, the edge of the openings of the photoresist film are shifted outside from the middle of the device isolation film by a prescribed value or more, whereby characteristics changes of the MISFETs due to the shadowing can be prevented even when the devices are downsized.

The semiconductor device and the method of manufacturing the same according to a second embodiment of the present invention will be explained with reference to FIGS. 13 to 15C. The same members of the present embodiment as those of the semiconductor device and the method of manufacturing the same according to the first embodiment shown in FIGS. 1 to 12B are represented by the same reference numbers not to repeat or to simplify the explanation.

Figure 13:
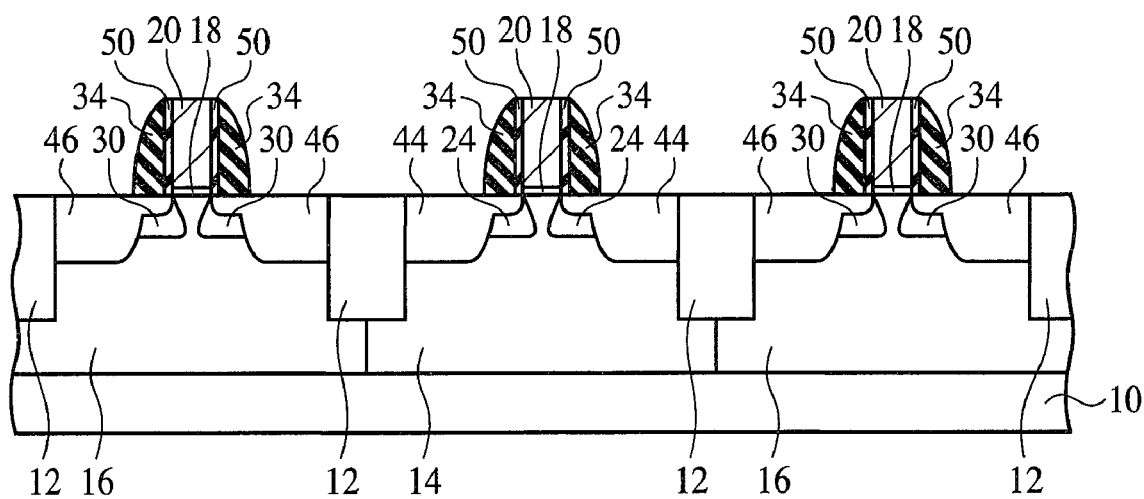
FIG. 13 is a diagrammatic sectional view showing the structure of the semiconductor device according to a second embodiment of the present invention.

FIG. 13 is a diagrammatic sectional view showing the structure of the semiconductor device according to the present embodiment. FIGS. 14A-14C and 15A-15C are sectional views showing the method of manufacturing the semiconductor device according to the present embodiment.

First, the structure of the semiconductor device according to the present embodiment will be explained with reference to FIG. 13.

In a silicon substrate 10, a device isolation film 12 for defining active regions is formed. In the drawing, the middle active region is an n-channel MISFET forming region, and the left and the right active regions are p-channel MISFET forming regions. In the silicon substrate 10 of the n-channel MISFET forming region, a p-well 14 is formed. In the silicon substrate 10 of the p-channel MISFET forming regions, n-wells 16 are formed.

In the active region of the n-channel MISFET forming region, a gate electrode 10 is formed with a gate insulating film 18 interposed therebetween. On the side walls of the gate electrode 10, sidewall insulating films 50, 34 are formed. In the silicon substrate 10 on both sides of the gate electrode 20, p-type pocket regions 24 and n-type source/drain regions 44 are formed. Thus, in the n-channel MISFET forming region, an n-channel MISFET including the gate electrode 20, the source/drain regions 44 and the pocket regions 24 is formed.

In the active regions of the p-channel MISFET forming regions, gate electrodes 20 are formed with the gate insulating film 18 interposed therebetween. On the side walls of the gate electrodes 20, the sidewall insulating films 50, 34 are formed. In the silicon substrate 10 on both sides of each gate electrode 20, n-type pocket regions 30 and p-type source/drain regions 46 are formed. Thus, in the p-channel MISFET forming regions, p-channel MISFETs each including the gate electrode 20, the source/drain regions 46 and the pocket regions 30 are formed.

As described above, the semiconductor device according to the present embodiment has the same basic structure as that of the semiconductor device according to the first embodiment shown in FIG. 1. A main characteristic of the semiconductor device according to the present embodiment is that the thin sidewall insulating film 50 is formed between the gate electrodes 20 and the sidewall insulating film 34.

The sidewall insulating film 50 is for adjusting implanted positions of the extension regions of the source/drain regions 44, 46 with respect to the gate electrodes 20. In the semiconductor device according to the first embodiment, the impurity diffused regions 26, 32 to be the extension regions of the source/drain regions 44, 46 are formed by self-alignment with only the gate electrodes 20, but in the semiconductor device according to the present embodiment, the impurity diffused regions 26, 32 are formed by self-alignment with the gate electrodes 20 and the sidewall insulating film 50.

Next, the method of manufacturing the semiconductor device according to the present embodiment will be explained with reference to FIGS. 14A to 15C.

Figure 14A:
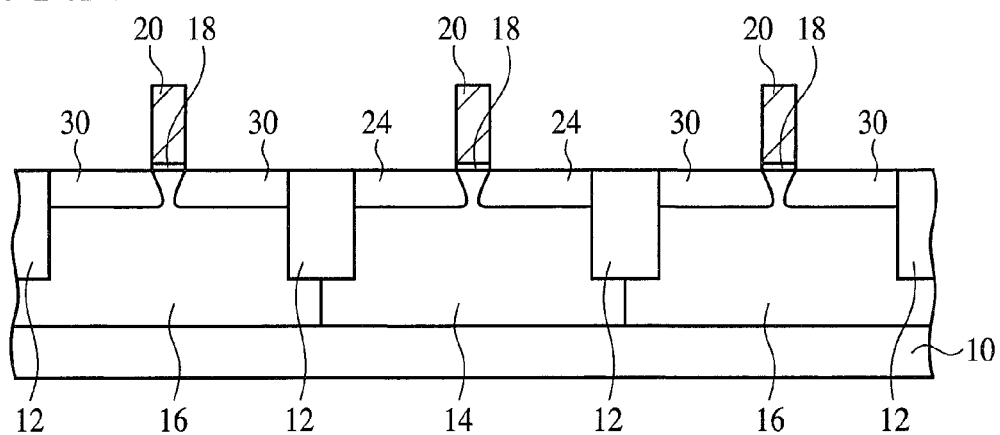
FIGS. 14A-14C and 15A-15C are sectional views showing the method of manufacturing the semiconductor device according to the second embodiment of the present invention.

In the same way as in, e.g., the method of manufacturing the semiconductor device according to the first embodiment shown in FIGS. 2A to 4B, in the silicon substrate 10, the device isolation film 12, the p-well 14, the n-well 16, the gate insulating film 18, the gate electrodes 20 and the pocket regions 24, 30 are formed (FIG. 14A). In the method of manufacturing the semiconductor device according to the present embodiment, the impurity diffused regions 26 are not formed in the step of FIG. 3C, and in the step of FIG. 4B, the impurity diffused regions 32 are not formed.

Figure 14B:
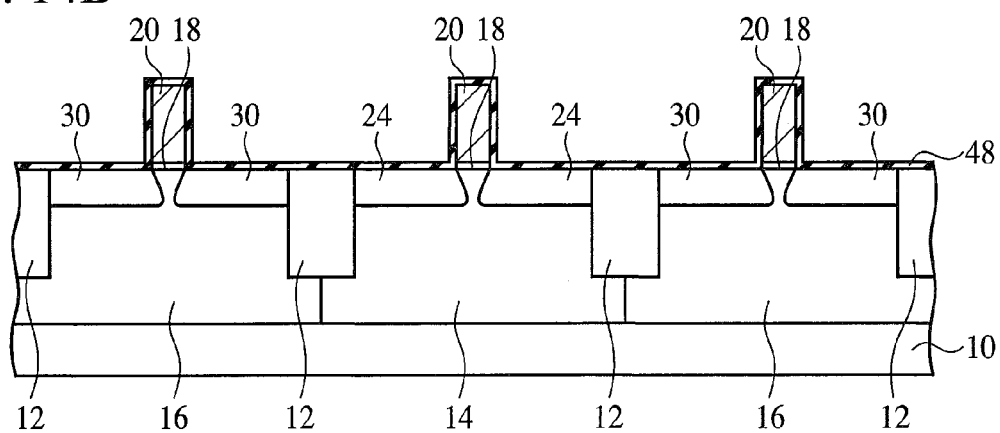

Next, over the entire surface, a 10 nm-thickness silicon oxide film 48, for example, is deposited by, e.g., CVD method (FIG. 14B).

Figure 14C:
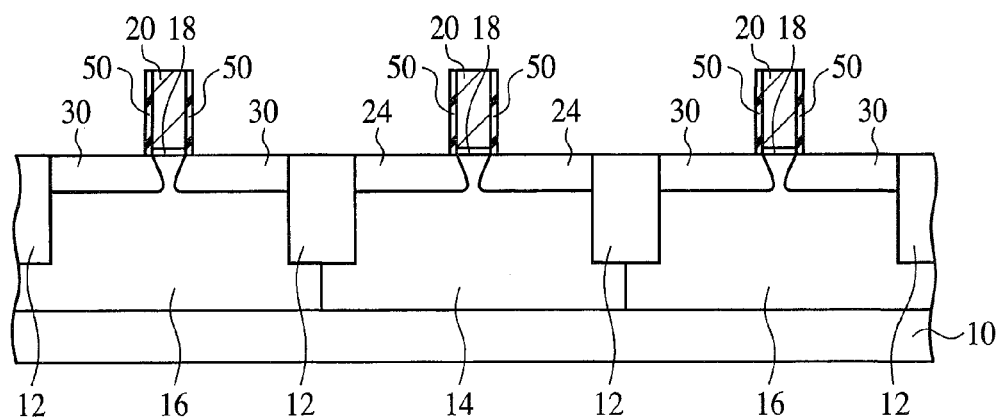

Then, by reactive ion etching with, e.g., C$_4$F$_8$ as the main etching gas, the silicon oxide film 48 is anisotropically etched to cause the silicon oxide film 48 to remain selectively on the side walls of the gate electrodes. Thus, on the side walls of the gate electrodes 20, the sidewall insulating film 50 of the silicon oxide film 48 is formed (FIG. 14C).

The insulating film for forming the sidewall insulating film 50 may be an insulating material other than silicon oxide film, e.g., silicon nitride film, silicon oxynitride film, alumina film or others. In forming the insulating film of such material, it is preferable set the film depositing temperature at not more than 600° C. so as to suppress the diffusion of the impurity forming the pocket regions 24, 30.

Then, by photolithography, a photoresist film 52 covering the p-channel MISFET forming regions and exposing the n-channel MISFET forming region is formed.

The photoresist film 52 is not a mask to be used in the tilt angle ion implantation, and it is not necessary to expand the opening as in the photoresist film 22. The edge of the opening of the photoresist film 52 can be set at the middle of the device isolation film (on the border between the n-channel MISFET forming region and the p-channel MISFET forming region), as in the general method.

Figure 15A:
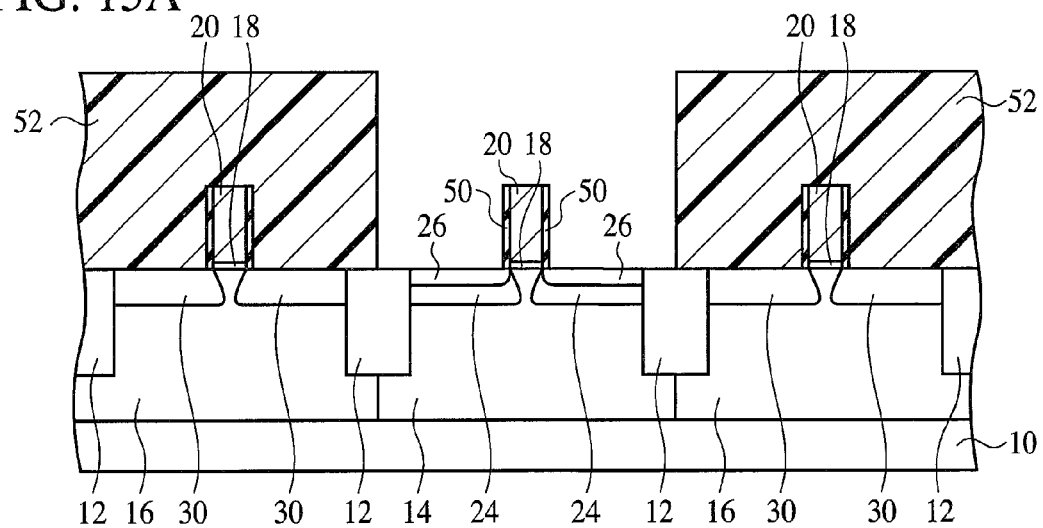

Next, with the photoresist film 52, the gate electrode 20 and the sidewall insulating film 50 as the mask, n-type impurity ions, e.g. phosphorus ions, are implanted to form the impurity diffused regions 26 as the extension regions in the substrate 10 on both sides of the gate electrode 10 (FIG. 15A). At this time, the phosphorus ions are implanted in the normal direction of the silicon substrate 10.

At this time, the photoresist film 52 has the opening not shifted toward the p-channel MISFET forming region, as does the photoresist film 22, whereby impurity ions for forming the impurity diffused regions 26 are effectively prevented from being implanted into the p-channel MISFET forming region.

As exemplified in FIG. 12, with the shift quantity ΔL and the shift quantity ΔW set near maximum values, there is a risk that due to the diffusion and scattering of an impurity for forming the impurity diffused regions 26, the implanted ions might be introduced into the source/drain regions of the inverse conduction type p-channel MISFET forming regions, consequently causing characteristics changes of the MIS- FETs. The impurity diffused regions 26 are formed by using the photoresist film 52 as in the present embodiment, whereby such disadvantage can be prevented.

The impurity diffused regions 26 are formed by self-alignment with the gate electrode 20 and the sidewall insulating film 50, which allows the position of the end of the gate electrode 20 to be adjusted by the thickness of the sidewall insulating film 50.

Next, by, e.g., ashing, the photoresist film 52 is removed.

Next, by photolithography, a photoresist film 54 for covering the n-channel MISFET forming region and exposing the p-channel MISFET forming regions is formed.

The photoresist film 54 is not a mask to be used in the tilt angle ion implantation, and it is not necessary to expand the opening as in the photoresist film 28. The edge of the opening of the photoresist film 54 can be set at the middle of the device isolation film (on the border between the n-channel MISFET forming region and the p-channel MISFET forming region), as in the general method.

Figure 15B:
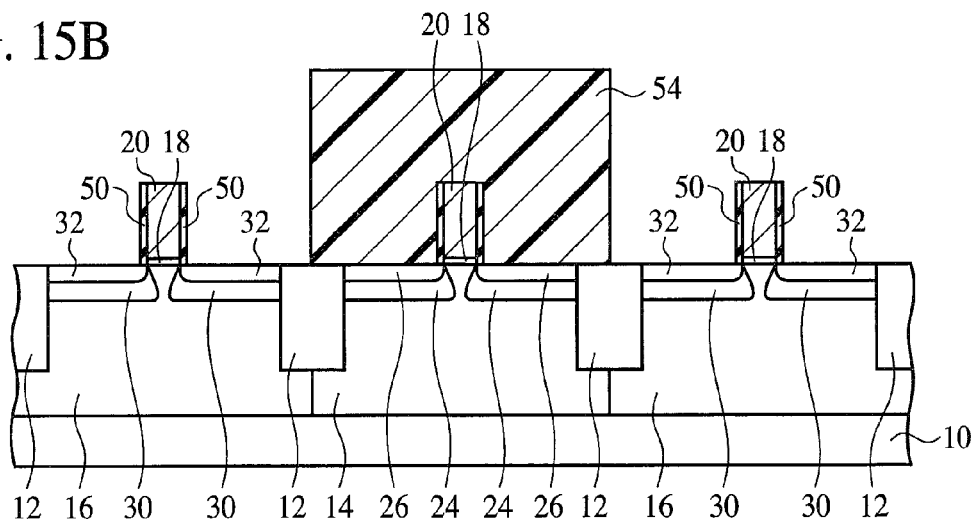
Figure 15C:
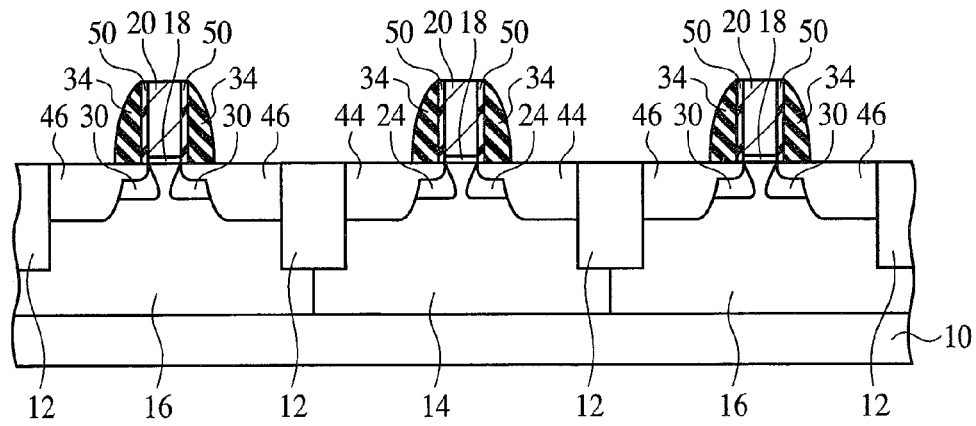

Next, with the photoresist film 54, the gate electrodes 20 and the sidewall insulating film 50 as the mask, p-type impurity ions, e.g. boron ions, are implanted to form the impurity diffused regions 32 as the extension regions in the substrate 10 on both sides of the gate electrode 10 (FIG. 15B). At this time, the phosphorus ions are implanted in the normal direction of the silicon substrate 10.

At this time, the photoresist film 54 has the opening not shifted toward the n-channel MISFET forming region, as does the photoresist film 28, whereby impurity ions for forming the impurity diffused regions 32 are effectively prevented from being implanted into the n-channel MISFET forming region.

As exemplified in FIG. 12, with the shift quantity $\Delta L$ and the shift quantity $\Delta W$ set near maximum values, there is a risk that due to the diffusion and scattering of an impurity for forming the impurity diffused regions 32, the implanted ions might be introduced into the source/drain regions of the inverse conduction type n-channel MISFET forming region, consequently causing characteristics changes of the MISFETs. The impurity diffused regions 26 are formed by using the photoresist film 52 as in the present embodiment, whereby such disadvantage can be prevented.

The impurity diffused regions 32 are formed by self-alignment with the gate electrodes 20 and the sidewall insulating film 50, which allows the positions of the ends of the gate electrodes 20 to be adjusted by the thickness of the sidewall insulating film 50.

Next, by, e.g., ashing, the photoresist film 54 is removed.

Then, in the same way as in the method of manufacturing the semiconductor device according to, e.g., the first embodiment shown in FIGS. 4C to 5C, the sidewall insulating film 34 and the source/drain regions 44, 46 are formed, an n-channel MISFET including the gate electrode 20, the source/drain regions 44 and the pocket regions 24 is formed in the n-channel MISFET forming region, and p-channel MISFETs each including the gate electrode 20, the source/drain regions 46 and the pocket regions 30 are formed in the p-channel MISFET forming regions.

As described above, according to the present embodiment, in forming the pocket regions of the MISFETs by tilt angle ion implantation, the edges of the opening of the photoresist films are shifted by a prescribed value or more outward from the middle of the device isolation film, whereby characteristics changes of the MISFETs due to the shadowing can be prevented even when the devices are downsized.

The photoresist film for forming the impurity diffused regions to be the extension regions is formed independently of the photoresist film for forming the pocket regions, whereby even when the edges of the openings of the photoresist film for forming the pocket regions is shifted, characteristic changes of the adjacent inverse conduction-type MISFETs can be prevented.

The semiconductor device and the method of manufacturing the same according to a third embodiment of the present invention will be explained with reference to FIGS. 16 to 20B. The same members of the present embodiment as those of the semiconductor device and the method of manufacturing the same according to the first and the second embodiments shown in FIGS. 1 to 15C are represented by the same reference numbers not to repeat or to simplify their explanation.

Figure 16:
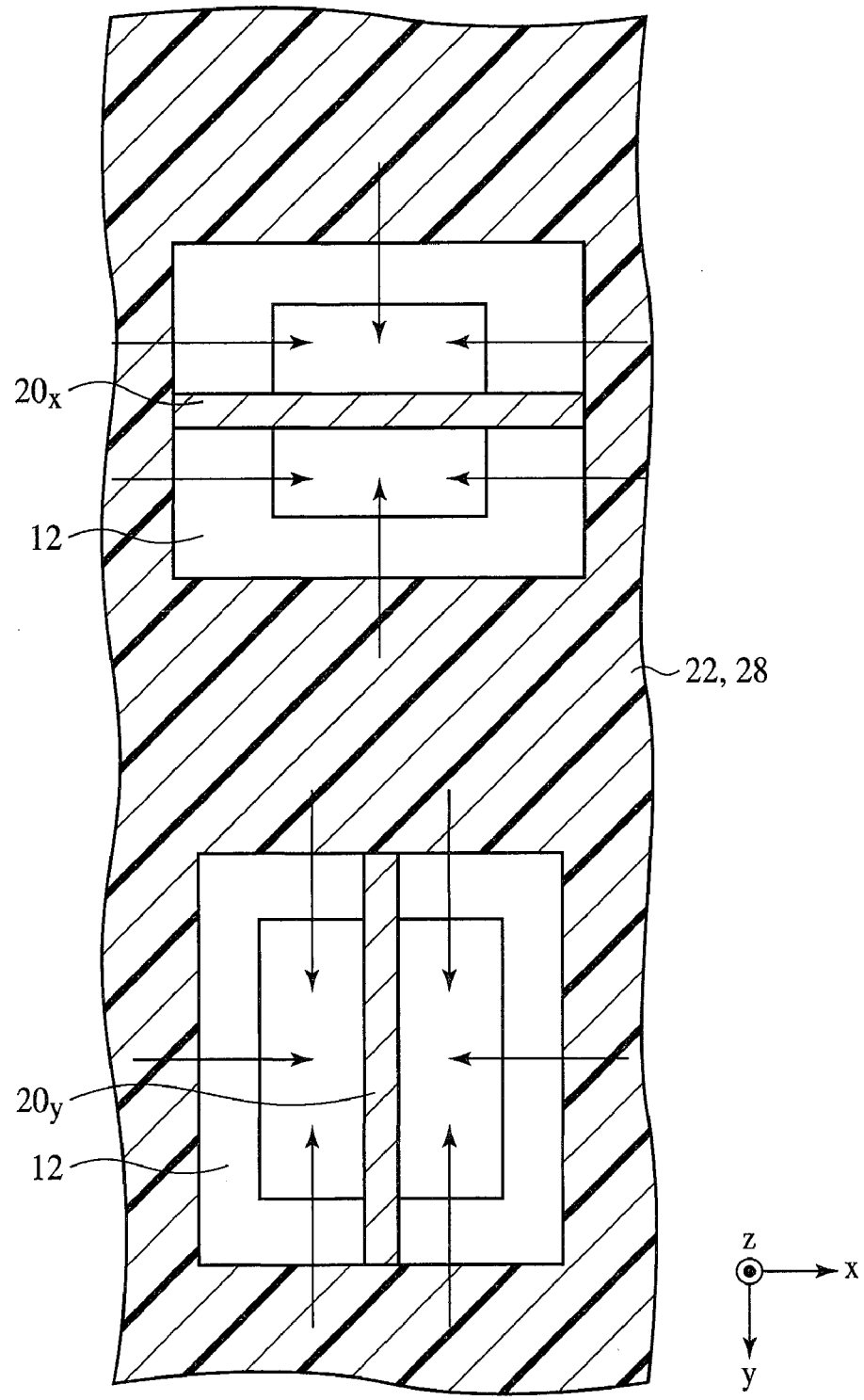
FIG. 16 is a plan view showing the directions of the pocket ion implantation in the method of manufacturing the semiconductor device according to the first and the second embodiments of the present invention.
Figure 17:
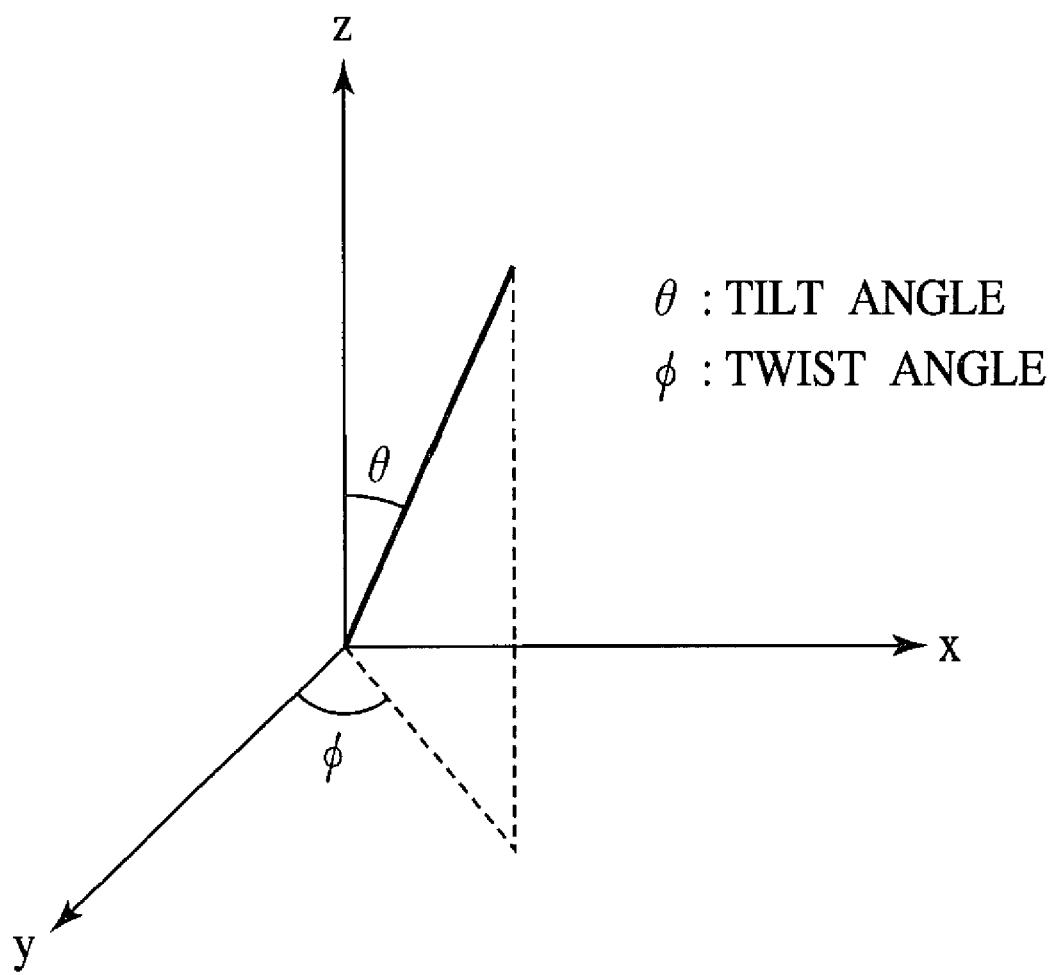
FIG. 17 is a view explaining the tilt angle and twist angle of the ion implantation.
Figure 18:
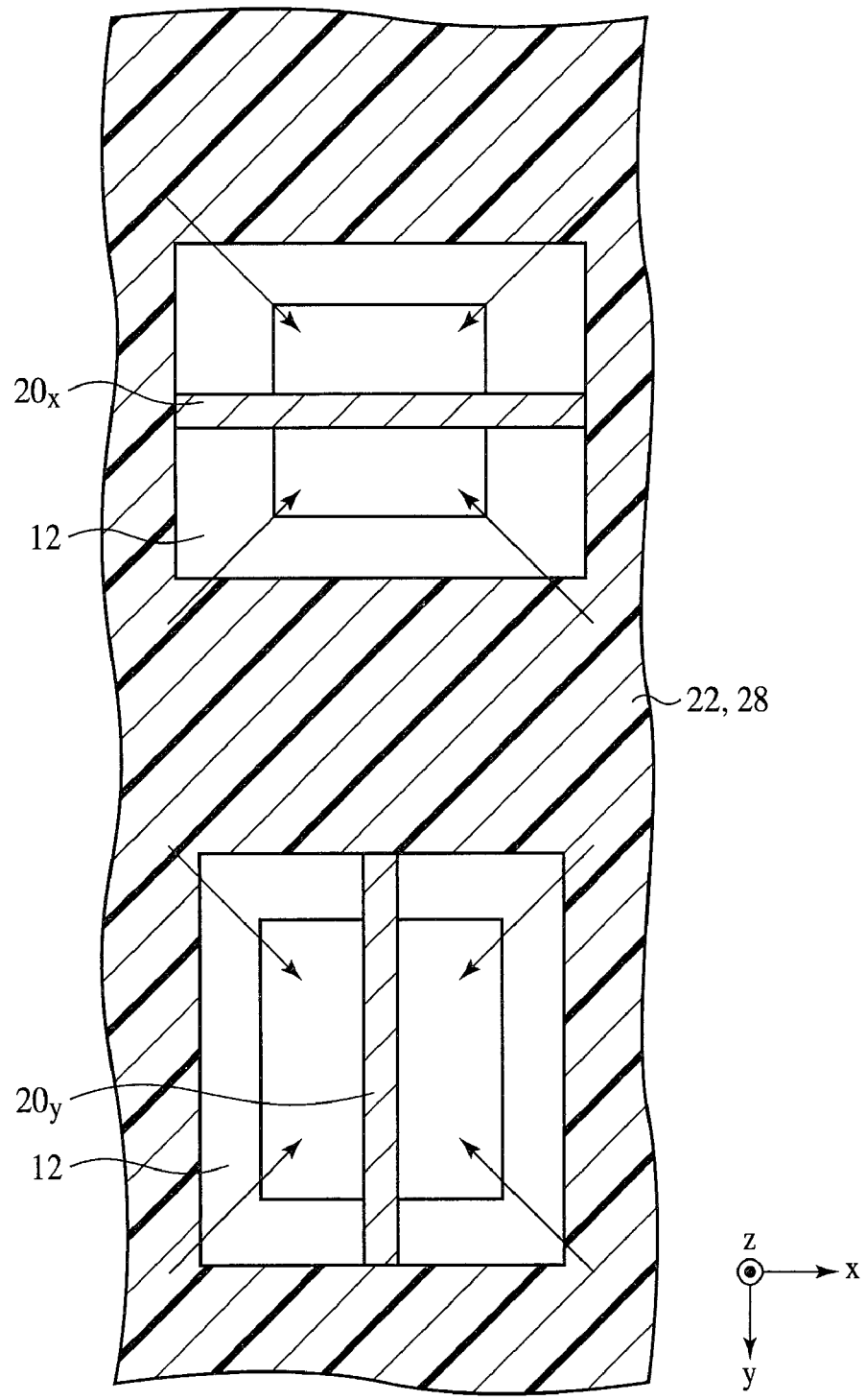
FIG. 18 is a plan view showing the directions of the pocket ion implantation in the method of manufacturing the semiconductor device according to a third embodiment of the present invention.
Figure 19A:
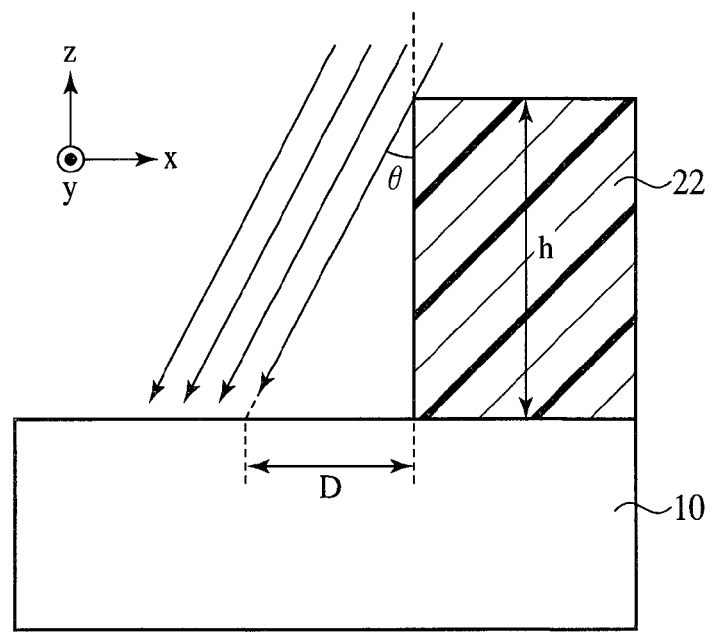
FIG. 19A is a sectional view showing the influence of the shadowing in the method of manufacturing the semiconductor device according to the first and the second embodiments of the present invention.
Figure 19B:
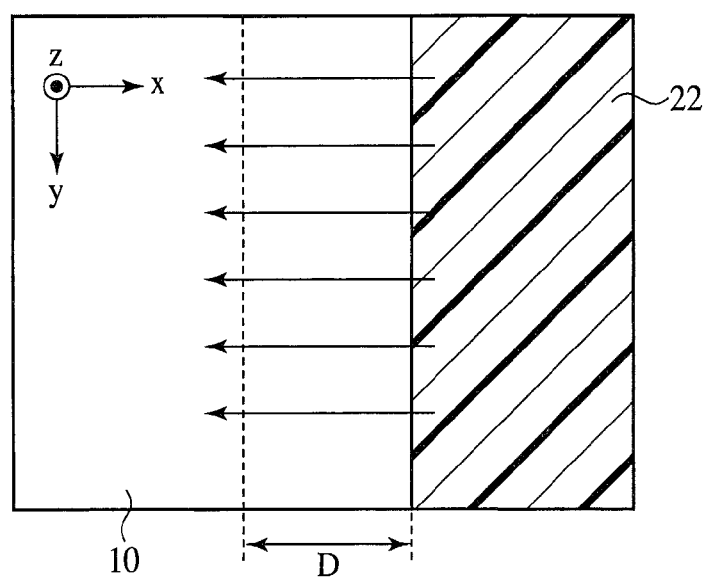
FIG. 19B is a plan view showing the influence of the shadowing in the method of manufacturing the semiconductor device according to the first and the second embodiments of the present invention.
Figure 20A:
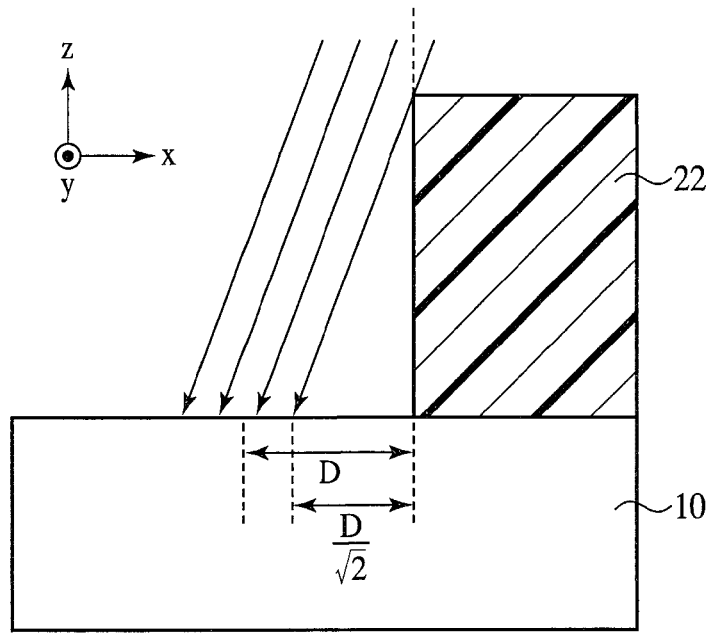
FIG. 20A is a sectional view showing the influence of the shadowing in the method of manufacturing the semiconductor device according to the third embodiment of the present invention.
Figure 20B:
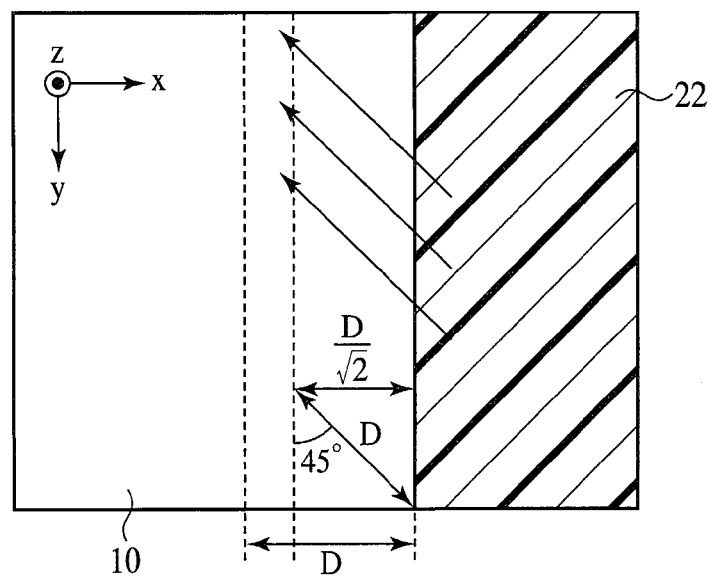
FIG. 20B is a plan view showing the influence of the shadowing in the method of manufacturing the semiconductor device according to the third embodiment of the present invention.

FIG. 16 is a plan view showing the directions of the pocket ion implantation in the method of manufacturing the semiconductor device according to the first and the second embodiments. FIG. 17 is a view explaining the tilt angle and twist angle of the ion implantation. FIG. 18 is a plan view showing the directions of the pocket ion implantation in the method of manufacturing the semiconductor device according to the present embodiment. FIG. 19A is a sectional view showing the influence of the shadowing in the method of manufacturing the semiconductor device according to the first and the second embodiments. FIG. 19B is a plan view showing the influence of the shadowing in the method of manufacturing the semiconductor device according to the first and the second embodiments. FIG. 20A is a sectional view showing the influence of the shadowing in the method of manufacturing the semiconductor device according to the present embodiment. FIG. 20B is a plan view showing the influence of the shadowing in the method of manufacturing the semiconductor device according to the present embodiment.

FIG. 16 is a plan view of the semiconductor device according to the first embodiment in the step of FIG. 3B or FIG. 4B. In the drawings, the x-axis and the y-axis are 2 directions which are orthogonal to each other and are parallel with the substrate surface, and the z-axis is a normal direction of the substrate.

The general semiconductor device includes MISFETs having gate electrodes extended in two axial directions orthogonal to each other. That is, as exemplified in FIG. 16, the MISFET including a gate electrode $20_x$ extended in the x-axial direction (transversally in the drawing), and a MISFET including the gate electrode $20_y$ extended in the y-axial direction (vertically in the drawing).

Then, in the first and the second embodiments, to make the pocket ion implantation in the same way into the MISFET including the gate electrode $20_x$ and the MISFET including the gate electrode $20_y$, the pocket ion implantation is made in four directions (indicated by the arrows in FIG. 16) in which the advance direction of the implanted ions as viewed in plane are parallel or perpendicular to the extending directions of the gate electrodes 20. That is, in the coordinate system shown in FIG. 17, the ion implantation is made in four directions which are tilted by an angle θ (tilt angle) to the substrate normal (z) direction in the respective directions forming angles Φ (twist angles) of 0 degree, 180 degree and ±90 degrees to the y direction in the substrate plane. Thus, in both of the MISFET having the gate electrode $20_x$ and the MISFET having the gate electrode $20_y$, the pocket regions having the same impurity profile can be formed.

On the other hand, in the present invention, as shown in FIG. 18, the pocket ion implantation is made in four directions (indicated by the arrows in FIG. 18) in which the advance direction of the implanted ions as viewed in plane have 45 degrees with respect to the extending directions of the gate electrodes 20. That is, in the coordinate system shown in FIG. 17, the ion implantation is made in four directions which are tilted by an angle θ (tilt angle) to the substrate normal (z) direction in the respective directions forming angles Φ (twist angles) of ±45 degrees and ±135 degrees to the y direction in the substrate plane. Also by setting the implantation directions of the pocket ion implantation at such four directions, the pocket regions 24, 30 of the same impurity profile can be formed both in the MISFET including the gate electrode $20_x$ and in the MISFET including the gate electrode $20_y$.

As a merit of applying the method of manufacturing the semiconductor device according to the present embodiment, the influence of the shadowing of the photoresist film can be suppressed.

Here, the tilt angle ion implantation at a tilt angle θ with the photoresist film 22 (or the photoresist film 28) of a film thickness h as the mask will be described.

FIGS. 19A and 19B are a sectional view and a plan view schematically showing the influence of the shadowing in the ion implantation made at a twist angle Φ of 90 degrees. FIGS. 20A and 20B are a sectional view and a plan view schematically showing the influence of the shadowing in the ion implantation at a twist angle Φ 45 degrees. FIGS. 19A and 19B are for the first and the second embodiments and FIGS. 20A and 20B are for the present embodiment.

When the twist angle Φ is 90 degrees, as shown in FIG. 19B, the advance direction of the implanted ions in as viewed in plane is perpendicular to the edge of the photoresist film 22. In this case, a width of the region into which the ions are not implanted due to the shadowing of the photoresist film 22 is assumed to be D (=h×tan θ) (refer to FIG. 19A).

On the other hand, when the twist angle Φ is 45 degrees, as shown in FIG. 20B, the advance direction of the implanted ions as viewed in plane is 45 degrees to the edge of the photoresist film 22. Here, what is influenced by the shadowing of the photoresist film 22 is the region of the intrusion distance of less than D as viewed in plane. That is, a width of the region into which the ions are not implanted due to the shadowing of the photoresist film 22 is as follows (refer to FIG. 20B)

$$D \times \sin \Phi = D/\sqrt{2}$$

As described above, the twist angle Φ is set at 45 degrees, the width of the region to be influenced by the shadowing can be reduced to $1/\sqrt{2}$ times.

That is, when formulas (2) to (5) are rewritten, taking into consideration the twist angle Φ, the following formulas are given.

$$L < h \times \tan \theta \times |\sin \Phi| + d_1 \quad (2')$$

$$\Delta L \geq h \times \tan \theta \times |\sin \Phi| + d_1 - L \quad (3')$$

$$W_2 + d_2 < h \times \tan \theta \times |\sin \Phi| \quad (4')$$

$$\Delta W \geq h \times \tan \theta \times |\sin \Phi| - W_2 - d_2 \quad (5')$$

Accordingly, in the method of manufacturing the semiconductor device according to the present embodiment, the edge of the opening of the photoresist film 22, which is parallel to the extending direction of the gate electrode, is shifted by a shift quantity $\Delta L$ (>(h×tan θ)/√2+$d_1$−L) from the middle of the device isolation film 12 toward the p-channel MISFET forming region when the distance L from the end of the gate electrode 20 to the middle of the device isolation film 12 is L<(h×tan θ)/√2+$d_1$.

The edge of the opening of the photoresist film 22, which is perpendicular to the extending direction of the gate electrode 20 is shifted from the middle of the device isolation film 12 toward the p-channel MISFET forming region by a shift quantity $\Delta W (\geq (h \times \tan \theta)/\sqrt{2} - W_2 - d_2)$ from the middle of the device isolation film 12 toward the p-channel MISFET forming region when $W_2 + d_2 < (h \times \tan \theta)/\sqrt{2}$.

As described above, according to the present embodiment, in the ion implantation for forming the pocket regions, the ion implantation is made in four directions forming 45 degrees to the gate electrode as viewed in plane, whereby the width in which the shadowing takes place can be reduced to $1/\sqrt{2}$ in comparison with the tilt angle ion implantation in four directions parallel and perpendicular to the gate electrode as viewed in plane. Thus, characteristics changes of the MISFETs due to the shadowing can be prevented when further downsized.

The present invention is not limited to the above-described embodiments and can cover other various modifications.

For example, in the first to the third embodiments, patterns on reticles to be used in forming the photoresist films 22, 28 are altered to thereby shift the edges of the openings of the photoresist films 22, 28, but the edges of the photoresist films 22, 28 may be shifted by controlling exposure conditions without altering the patterns on the reticles.

The photoresist films 22, 28, which are formed by photolithography, can have the edges of the openings shifted by changing conditions of the lithography, e.g., the exposing amount, etc. For example, for the positive resist, the exposing amount is increased beyond a prescribed exposing amount to thereby increase the size of the openings. Accordingly, the present invention is made applicable by setting exposure conditions so that this size shift quantity can satisfy the conditions for $\Delta L$ and $\Delta W$.

However, making the size shift by the exposing amount, shift quantities cannot be defined for the respective edges of the photoresist films 22, 28. For both of the edge of the opening of the photoresist film 22, which is parallel to the extending direction of the gate electrode 10 and the edge of the opening of the photoresist film 22, which is perpendicular to the extending direction of the gate electrode 20, in order to prevent the characteristics change of the MISFETs by the shadowing, exposure conditions are set so that out of a shift quantity $\Delta L$ and a shift quantity $\Delta W$, the larger one can be obtained. For example, when the shift quantity $\Delta L$ is 13 nm, and the shift quantity $\Delta W$ is 23 nm as in the first embodiment, the exposure conditions for the photoresist films 22, 28 may be set so that the shift quantity is not less than 23 nm.

The exposing amount is substantially simply proportional with the resist width after developed, and the exposure conditions can be altered to satisfy an arbitrary shift quantity.

In the above-described embodiments, the method of shifting the edge of the opening of the photoresist film 22, which is parallel to the extending direction of the gate electrode 20 and the edge of the opening of the photoresist film 22, which is perpendicular to the extending direction of the gate electrode 20 is described. However, when the distance L and the width $W_1$, $W_2$ are sufficiently large not to block the pocket implantation into the active region, the shift may be made for either of the edge of the opening of the photoresist film 22, which is parallel with the extending direction of the gate electrode 20 and the edge of the opening of the photoresist film 22 perpendicular to the extending direction of the gate electrode 20. Elements formed on the same semiconductor substrate have different distances L and widths $W_1$, $W_2$, depending on a layout, and the shift may be made only for elements which will be subjected to the shadowing.

In the first and the second embodiments, the pocket regions are provided in both the n-channel MISFET and the p-channel MISFET. However, the pocket regions may be provided in either of the MISFETs.

In the second embodiment, the impurity diffused regions 26, 32 to be the extension regions are formed by self-alignment with the sidewall insulating film 50. However, either of the impurity diffused regions 26, 32 may be formed by self-alignment with the sidewall insulating film 50.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method of manufacturing a semiconductor device comprising:
   forming, in a semiconductor substrate between a first region and a second region, a device isolation film;
   forming, above the semiconductor substrate in the first region, a gate insulating film and a gate electrode;
   forming, above the semiconductor substrate and the gate electrode, a first photoresist film covering the second region and having an opening exposing the first region and having an edge at a position nearer the second region than a middle of the device isolation film; and
   implanting impurity ions from a direction tilted from a normal direction of the semiconductor substrate with the first photoresist film and the gate electrode as a mask to form a pair of pocket regions in the semiconductor substrate in areas both sides of the gate electrode, wherein
   for the edge of the opening parallel to an extending direction of the gate electrode, the opening of the first photoresist film is formed so that, when $$L < h \times \tan\theta \times |\sin\Phi| + d_1$$

wherein a distance from an end of the gate electrode to the middle of the device isolation film is L; a film thickness of the first photoresist film is h; a tilt angle of an ion implantation to the normal direction of the semiconductor substrate is $\theta$; a twist angle of the ion implantation to the extending direction of the gate electrode is $\Phi$; and a minimum width, of a width from the end of the gate electrode of a region into which the ion implantation is made without an influence of a shadowing of the first photoresist film, which produces a threshold voltage roll-off characteristic of a MISFET equivalent to those produced by ion implantation for forming the pocket regions without forming the first photoresist film is $d_1$, is given, $$\Delta L > h \times \tan\theta \times |\sin\Phi| + d_1 - L$$

wherein a shift quantity from the middle of the edge of the opening toward the second region is $\Delta L$, can be given.

2. The method of manufacturing a semiconductor device according to claim 1, wherein the opening of the first photoresist film is formed so that $$\Delta L \leq W_1$$

wherein a distance from the first region to the middle of the device isolation film is $W_1$.

3. A method of manufacturing a semiconductor device comprising:
   forming, in a semiconductor substrate between a first region and a second region, a device isolation film;
   forming, above the semiconductor substrate in the first region, a gate insulating film and a gate electrode;
   forming, above the semiconductor substrate and the gate electrode, a first photoresist film covering the second region and having an opening exposing the first region and having an edge at a position nearer the second region than a middle of the device isolation film; and
   implanting impurity ions from a direction tilted from a normal direction of the semiconductor substrate with the first photoresist film and the gate electrode as a mask to form a pair of pocket regions in the semiconductor substrate in areas both sides of the gate electrode, wherein
   for the edge of the opening perpendicular to an extending direction of the gate electrode, the opening of the first photoresist film is formed so that, when $$W_2 + d_2 < h \times \tan\theta \times |\sin\Phi|$$

wherein a distance from the first region to the middle of the device isolation film is $W_2$; a film thickness of the first photoresist film is h; a tilt angle of an ion implantation to the normal direction of the semiconductor substrate is $\theta$; a twist angle of the ion implantation to the extending direction of the gate electrode is $\Phi$; and a minimum width, of a width from the end of the gate electrode of a region into which the ion implantation is made without an influence of a shadowing of the first photoresist film, which produces a threshold voltage roll-off characteristic of a MISFET equivalent to those produced by ion implantation for forming the pocket regions without forming the first photoresist film is $d_2$, is given, $$\Delta W \geq h \times \tan\theta \times |\sin\Phi| - W_2 - d_2$$

wherein a shift quantity from the middle of the edge of the opening toward the second region is $\Delta W$, can be given.

4. The method of manufacturing a semiconductor device according to claim 3, wherein the opening of the first photoresist film is formed so that $$\Delta W \leq W_2$$

wherein a distance from the first active region to the middle of the device isolation film is $W_2$.

5. The method of manufacturing a semiconductor device according to claim 1, further comprising after forming the gate electrode:
   implanting impurity ions from a normal direction of the semiconductor substrate with the gate electrode as a mask to form a pair of impurity diffused regions to be extension regions of source/drain regions in the semiconductor substrate on both sides of the gate electrodes.

6. The method of manufacturing a semiconductor device according to claim 5, wherein
   in forming the impurity diffused regions, the ion implantation is made with the first photoresist film and the gate electrode as a mask.

7. The method of manufacturing a semiconductor device according to claim 5,
   further comprising between forming the pocket regions and forming the impurity diffused regions, forming a second photoresist film covering the second region and exposing the first region, wherein
   in forming the impurity diffused regions, the ion implantation is made with the second photoresist film and the gate electrode as a mask.

8. The method of manufacturing a semiconductor device according to claim 7,
   further comprising between forming the pocket regions and forming the second photoresist film, forming a sidewall insulating film on side walls of the gate electrode, wherein in forming the impurity diffused regions, the ion implantation is made with the second photoresist film, the gate electrode and the sidewall insulating film as a mask.

9. The method of manufacturing a semiconductor device according to claim 1, wherein in forming the pocket regions, the impurity ions are implanted respectively from four directions at twist angles of 0 degree, 180 degrees and ±90 degrees to an extending direction of the gate electrode.

10. The method of manufacturing a semiconductor device according to claim 1, wherein in forming the pocket regions, the impurity ions are implanted respectively from four directions at twist angles of ±45 degrees and ±135 degrees to an extending direction of the gate electrode.

11. The method of manufacturing a semiconductor device according to claim 1, wherein in forming the first photoresist film, a pattern on a reticle to be used in forming the first photoresist film is altered to thereby shift the edge of the opening toward the second region beyond the middle of the device isolation film.

12. The method of manufacturing a semiconductor device according to claim 1, wherein in forming the first photoresist film, an exposure condition for forming the first photoresist film are altered to thereby shift the edge of the opening toward the second region beyond the middle of the device isolation film.

13. The method of manufacturing a semiconductor device according to claim 1, wherein the first region is a region for a first conduction type MISFET to be formed in, and the second region is a region for a MISFET of a second conduction type which is different from the first conduction type.

* * * * *